(12) United States Patent
Suguro et al.

(10) Patent No.: US 6,465,290 B1
(45) Date of Patent: Oct. 15, 2002

(54) METHOD OF MANUFACTURING A SEMICONDUCTOR DEVICE USING A POLYMER FILM PATTERN

(75) Inventors: Kyoichi Suguro, Yokohama (JP); Kouji Matsuo, Yokohama (JP); Atsushi Murakoshi, Kawasaki (JP); Yasuhiko Sato, Yokohama (JP); Hiromi Niiyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/818,409

(22) Filed: Mar. 27, 2001

(30) Foreign Application Priority Data

Mar. 27, 2000 (JP) .................................... 2000-087651

(51) Int. Cl.[7] ............................................. H01L 21/338
(52) U.S. Cl. ...................................... 438/183; 257/407
(58) Field of Search ............................. 438/682, 296, 438/683–685, 183; 257/577, 407, 761

(56) References Cited

U.S. PATENT DOCUMENTS

| | | | | |
|---|---|---|---|---|
| 5,776,659 A | * | 7/1998 | Watanabe et al. | 430/296 |
| 6,025,117 A | * | 2/2000 | Nakano et al. | 430/314 |
| 6,054,355 A | * | 4/2000 | Inumiya et al. | 438/296 |
| 6,251,778 B1 | * | 6/2001 | Fang et al. | 438/682 |
| 6,376,888 B1 | * | 4/2002 | Tsunashima et al. | 257/407 |

FOREIGN PATENT DOCUMENTS

| | | |
|---|---|---|
| JP | 10-261593 | 9/1988 |
| JP | 11-224947 | 8/1999 |

* cited by examiner

*Primary Examiner*—David Nelms
*Assistant Examiner*—David Vu
(74) *Attorney, Agent, or Firm*—Frommer Lawrence & Haug LLP; Grace L. Pan

(57) ABSTRACT

Claimed and disclosed is a method of manufacturing a semiconductor device, the method comprising the steps of forming a dummy gate on a semiconductor substrate, forming a source-drain diffusion region by introducing an impurity into the semiconductor substrate having the dummy gate as a mask, removing the dummy gate to form an opening, and forming a gate electrode within the opening with a gate insulating film formed below the gate electrode. The dummy gate is further formed by coating the semiconductor substrate with a polymer having a higher carbon content than hydrogen content so as to form a polymer film, forming a photoresist pattern on the polymer film, and transferring the pattern shape of the photoresist pattern onto the polymer film.

19 Claims, 13 Drawing Sheets

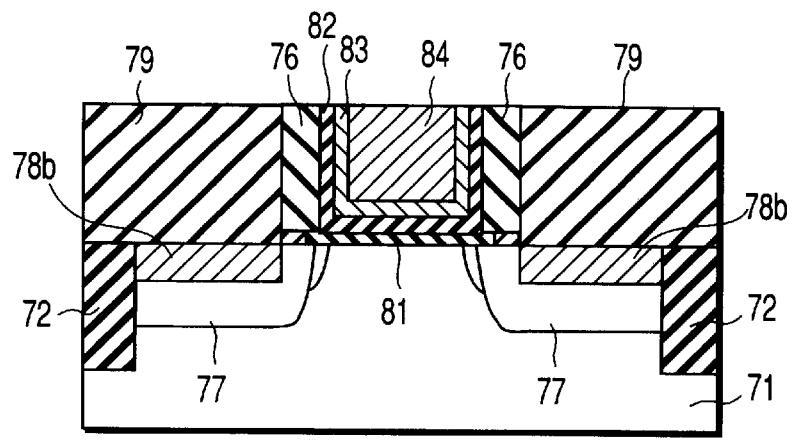
F I G. 4
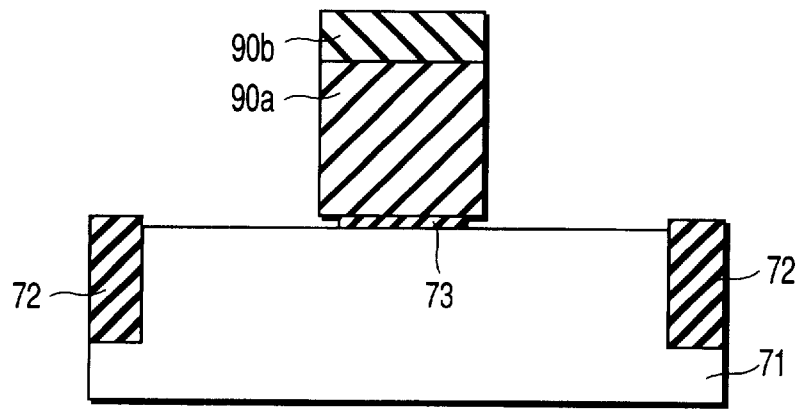
F I G. 5
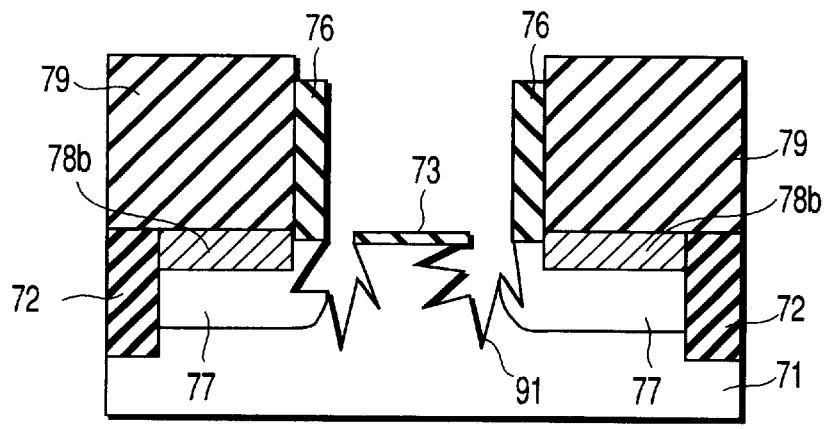
F I G. 6

METHOD OF MANUFACTURING A SEMICONDUCTOR DEVICE USING A POLYMER FILM PATTERN

RELATED APPLICATIONS

This application claims priority from the Japanese Patent Application No. 2000-087651, filed Mar. 27, 2000, the entire contents of which are incorporated herein by reference.

BACKGROUND OF THE INVENTION

1. Field of the Invention

The present invention directs to a method of manufacturing a semiconductor device, particularly, to a method of manufacturing a semiconductor device featured in the ion implantation step and to a method of manufacturing a semiconductor device featured in the step of forming the gate electrode of a transistor.

2. Description of the Related Art

In recent years, a large scale integration ("LSI"), in which many transistors and resistors are connected to each other to form an electric circuit and are mounted integrally on a single chip, could be used in some portions of an electronic computer or a communication appliance. Therefore, the performance of an entire apparatus can be heavily related to the performance of the LSI single body. The performance of the LSI single body can be improved by increasing the degree of integration, i.e., by improving the elements quality of the chips.

The elements can be improved by rendering optimum the ion implantation for forming the diffusion layers, such as the source-drain diffusion layers and the annealing treatment after the ion implantation. As a result, it is possible to obtain a metal oxide semiconductor ("MOS") transistor having shallow source-drain diffusion layers having a depth not larger than 0.2 μm.

If ions are implanted into a silicon substrate, crystal defects can be generated in the silicon substrate. It is commonly known in the art that the crystal defects do not decrease in the subsequent heat treatment, thus causing the weakening of the mechanical strength of the silicon substrate by multiple repetitions of the ion implantation and the heat treatment process.

The silicon substrate may be cooled during the ion implantation process to avoid the problem discussed above, thereby suppressing the migration of the atomic void during the ion implantation. As a result, it is possible to permit the interstitial atom introduced by the ion implantation to be coupled with the atomic void so as to eliminate the defect.

However, if a silicon substrate is cooled to about −160° C. and an ion implantation is applied to the silicon substrate by masking the region other than the region in which the ion implantation is performed with a photoresist used in an ordinary lithography, cracks 122 are generated in a resist mask 118, as shown in a cross sectional view in FIG. 1. It is commonly understood that one of the causes of a crack may be attributable to the fact that water within the photoresist was initially frozen then when submitted to heat treatment, the volume of the water expands. If cracks are generated in the resist, ions are implanted into the masked region, too, so as to deteriorate the pn junction characteristics, resulting in failure to obtain a desired atomic characteristic. In the worst scenario, cracks can also be generated in the underlying insulating film where the cracks are generated on the resist pattern. The problem is that, if a crack is generated in the photoresist, ions are implanted into an undesired region. This phenomenon will now be explained with reference to FIG. 1.

Specifically, FIG. 1 is a cross sectional view of a construction of a Complementary Metal Oxide Semiconductor-Field Effect Transistor ("CMOS-FET") where an ion implantation is performed using a conventional photoresist as a mask.

The CMOS-FET shown in FIG. 1 is obtained by the following steps. In the first step, an n-type well 112, a p-type well 113, and an insulating film 114 for element isolation are formed in a semiconductor substrate 111. Then, a gate insulating film 115 is formed on the surface of the semiconductor substrate 111, followed by forming a gate or a dummy gate 116, which will be described in further detail. After formation of electrode 116, a p-type impurity layer 117 is formed by implanting ions of boron ("B") or boron fluoride ("$BF_3$") into semiconductor substrate 111 in a concentration of approximately $1 \times 10^{14}$ to $5 \times 10^{15}$ cm$^{-2}$. Further, a photoresist layer is formed in a thickness of approximately 0.5 to 1.5 μm, followed by applying a light exposure and development so as to obtain a photoresist pattern 118. The photoresist pattern 118 thus formed is used as a mask for forming n-type impurity layers 120.

In the next step, an n-type impurity 119 such as arsenic ("As") or antimony ("Sb") is implanted in a concentration of approximately $1 \times 10^{14}$ to $5 \times 10^{15}$ cm$^{-2}$ as shown in FIG. 1 while cooling the substrate and having photoresist mask 118 formed thereon to temperatures not higher than −150° C. The method of manufacturing a transistor by using a photoresist mask as described has its shortcomings. Specifically, a crack 122 is generated in photoresist mask 118 in the cooling stage of semiconductor substrate 111. Therefore, n-type impurity 119 passes through crack 122 to form an n-type diffusion layer 121 in p-type impurity layer 117. As a result, the leak current through the pn junction is increased by at least two folds and, thus, it may not be possible to obtain good element characteristics.

Another method of miniaturizing the element may include using a dummy gate. In this method, a dummy gate of a laminate structure consisting of a silicon nitride film and a polycrystalline silicon ("poly-Si") film is formed first, followed by forming source-drain regions and an interlayer insulating film. Then, the surface of the dummy gate is exposed and the dummy gate is removed, followed by newly formed metal gate film. A transistor comprising a gate film formed by this method is called a damascene gate Metal Oxide Semiconductor Field Effect Transistor ("MOSFET"). An example of a manufacturing method of a damascene gate MOSFET will be described below.

FIGS. 2A to 2C and 3A to 3C collectively show another method of manufacturing a transistor by using a dummy gate.

In a first step, the structure shown in FIG. 2A is prepared and can be obtained as follows. Specifically, a groove is formed by dry etching on the surface of a silicon semiconductor substrate 71, followed by forming an insulating film within the groove by means of deposition or coating. It is possible to use a silicon oxide film as the insulating film. Alternatively, it is also possible to use a film of silicon nitric oxide ("SiNO") having a thermal expansion coefficient close to that of silicon, i.e., about 3 ppm/K. The surface of the insulating film thus formed is polished by a chemical mechanical polishing ("CMP") method or a mechanical polishing ("MP") method so as to form an insulating film 72 for element isolation.

Then, an oxide film 73 for a dummy gate is formed by thermal oxidation in a thickness of about 3 to 10 nm on an element region surrounded by insulating film 72 for element isolation, followed by forming a film for a dummy gate on oxide film 73. A laminate film consisting of a silicon nitride ("$Si_3N_4$") film and an amorphous silicon film or a laminate film consisting of a silicon nitride film and a poly-Si film are used as the film for the dummy gate. The film for the dummy gate thus formed is subjected to an anisotropic etching so as to form a dummy gate 90 equal in shape to the gate. In FIG. 2A, dummy gate 90 comprises an amorphous silicon film or poly-Si film 90a and a $Si_3N_4$ film 90b.

The particular laminate structure makes it possible to prevent the surface of the poly-Si film from being exposed to the outside in the subsequent planarizing process. As a result, it is possible to prevent the poly-Si film from performing a silicidation reaction with cobalt ("Co") in the subsequent silicidation process. Incidentally, the poly-Si film is selected as a material with a large etching selectivity relative to the thin insulating film 73 so as to permit the thin insulating film 73 to perform the function of the etching stopper in the step of removing the dummy gate, i.e., in the step of removing the poly-Si film, which is carried out after the silicidation process. It is possible to use an amorphous silicon film in place of the poly-Si film.

After the formation of dummy gate 90, it is possible to increase the thickness of oxide film 73 in the source-drain regions by thermal oxidation. Then, extension regions 75 of the source-drain regions can be formed by an ion implantation method, a plasma doping method, or a gaseous phase diffusion method with dummy gate 90 as a mask. Further, an electrical activation is achieved by applying a heat treatment at 800° C. to 900° C. for 30 seconds or less by employing Rapid Thermal Annealing ("RTA") in which the temperature can be elevated at a rate of at least approximately 100° C./sec.

In the subsequent step, the structure as shown in FIG. 2B is prepared. In the first step, a side wall insulating film 76 consisting of a silicon nitride film or a silicon oxynitride film is formed on the side wall of dummy gate 90 in a thickness of approximately 5 to 30 nm. Then, deep source-drain regions 77 are formed in silicon semiconductor substrate 71 by employing an ion implantation method, a plasma doping method, or a gaseous phase diffusion method. Further, an electrical activation is achieved by applying a heat treatment at 800° C. to 900° C. for 30 seconds or less by employing an RTA in which the temperature can be elevated at a rate of at least approximately 100° C./sec.

Then, oxide films 73 in source-drain 77 are removed by the treatment with, for example, hydrofluoric acid, followed by a silicide process for depositing on the entire surface a metal having a resistivity of about 20 Ω cm or less and capable of forming a silicide so as to form a metal film. Specifically, a metal film such as a cobalt film is deposited by a sputtering method in a thickness of about 10 to 20 nm. In the case of using a metal such as cobalt that does not reduce the silicon oxide film, it is desirable to deposit a metal, such as titanium, that is capable of reducing the silicon oxide film on the cobalt film because titanium is diffused into the cobalt film in the subsequent heat treating step so as to reduce the silicon oxide film, which was not removed completely, at the interface between the cobalt film and the silicon substrate.

It is possible to form a barrier film relative to, for example, nitrogen on the entire surface in order to prevent the surface of the cobalt film or the titanium film formed thereon from being nitrided in the subsequent heat treatment performed under a nitrogen atmosphere. It is possible to use, for example, a titanium nitride ("TiN") film as the barrier film.

Then, a heat treatment is applied under, for example, a nitrogen gas atmosphere. As a result, only cobalt deposited on source-drain regions 77 to perform a silicide-forming reaction so as to form selectively only a mono-silicide layer on source-drain regions 77.

The temperature of the heat treatment can be determined depending on the kind of the metal deposited. For example, if cobalt is deposited, mono-silicide of cobalt is formed by the heat treatment of about 500° C. However, when cobalt is deposited on element isolating insulating film 72, side wall insulating film 76 and silicon nitride film 90b in the upper portion of dummy gate 90 does not perform a silicide-forming reaction and cobalt remains unreacted. The unreacted cobalt can be selectively removed by using, for example, a mixed solution consisting of sulfuric acid and hydrogen peroxide solution. As a result, cobalt mono-silicide layers are selectively formed only on source-drain regions 77 and, then, a heat treatment is applied at about 800° C. so as to permit the cobalt mono-silicide layers 78a to react with silicon and, thus, forming cobalt disilicide layers 78b, as shown in FIG. 2C, thereby finishing the silicide process.

In the next step, an interlayer insulating film 79, such as a silicon oxide film, is formed by, for example, a Chemical Vapor Deposition ("CVD") method. It is possible to form the interlayer insulating film after depositing a thin film capable of suppressing the diffusion of cobalt, such as a silicon nitride film with a thickness of about 20 nm.

Further, as a planarizing process, the surface of interlayer insulating film 79 is planarized by, for example, a CVD method so as to expose the surface of silicon nitride film 90b formed on dummy gate 90, as shown in FIG. 3A, followed by removing silicon nitride film 90b by a treatment with a hot phosphoric acid so as to expose silicon film 90a, as shown in FIG. 3B.

In the next step, silicon film 90a is removed by a chemical dry etching performed by using a carbon tetrafluoride/oxygen ("$CF_4/O_2$") mixed gas, followed by removing thin oxide film 73 positioned below dummy gate 90 by treatment with diluted hydrofluoric acid, diluted ammonium fluoride or a mixed solution thereof so as to form an open portion 90', as shown in FIG. 3C.

Then, an oxide film 81 having a thickness not larger than 1 nm is formed on the surface of open portion 90', as shown in FIG. 4, followed by depositing an insulating film 82 having a relative dielectric constant larger than that of a silicon oxide film and a metal conductive film 83. Insulating film 82 can be formed of, for example, tantalum oxide ("$Ta_2O_5$"), titanium dioxide ("$TiO_2$"), zirconium oxide ("$ZrO_2$"), hafnium oxide ("$HfO_2$") or ceric oxide ("$CeO_2$"). On the other hand, metal conductive film 83, which determines the work function of the gate, can be formed in a thickness not larger than 10 nm by using, for example, a metal nitride. Further, a film of a metal having a low resistivity such as aluminum ("Al") or tungsten ("W") is deposited on the surface of metal conductive film 83. The metal film is planarized by CMP or MP and etched so as to finish formation of a gate 84, as shown in FIG. 4.

However, an additional problem is generated in the case of using a dummy gate. Specifically, a damascene gate MOSFET is a transistor of high performance as compared to a MOSFET, but requires a long manufacturing process. If calculated by raw process time ("RPT"), the manufacturing process is about 22 hours longer, when compared with another method of manufacturing a transistor. The reason for the difficulty is that, in the manufacture of a damascene gate MOSFET, about 20 hours is required for forming a dummy gate consisting of a silicon nitride ("$Si_3N_4$") film and a poly-Si film, and requires about 2 hours for removing the particular structure with phosphoric acid or a mixed gas consisting of $CF_4$ and $O_2$. What should also be noted is that, since the poly-Si film has a columnar crystal structure, an irregularity is formed on the side surface of the dummy gate. Since the width of the dummy gate is determined in view of the irregularity noted above, the processing accuracy of the gate size is poor. Incidentally, even if an amorphous silicon film is used in place of the poly-Si film, the amorphous silicon film is converted into a poly-Si film in the heat treating step and, thus, the problem remains unsolved.

In the method described above, an ion implantation is performed through oxide film 73 for forming extension regions 75 of the source-drain regions. It is desirable to carry out the ion implantation without causing the ions not to be implanted through oxide film 73 in order to achieve the junction depth not larger than 30 nm in the extension regions. However, it is impossible to carry out the ion implantation in this fashion because the problem described below is brought about in the dummy gate structure consisting of a silicon nitride film and a poly-Si film. Specifically, where oxide films 73 on the source-drain regions are removed after the dummy gate formation, shown in FIG. 2A, by the treatment with hydrofluoric acid diluted with water, oxide film 73 below the lower poly-Si film 90a constituting the dummy gate is partly removed, as shown in FIG. 5. This means that the lower oxide film 73 acting as an etching stopper is removed. It follows that, when poly-Si film 90a acting as the dummy gate is removed by etching, an etched region 91 of silicon substrate 71 is formed, as shown in FIG. 6, resulting in the impossibility of forming a transistor.

The disadvantages inherent in the prior art can be summarized as follows:
1. If a photoresist is cooled, cracks are generated. Therefore, ions are implanted into undesired regions of the silicon substrate, with the result that the pn junction characteristics of the element are deteriorated. In the worst case, cracks are also generated in the insulating film positioned below the photoresist mask.
2. The silicon nitride film and the poly-Si film (or amorphous silicon film) collectively constitutes a dummy gate which is formed by a CVD method, and is removed by a method using phosphoric acid or a mixed gas of $CF_4$ and $O_2$, leading to a long RPT. Also, since the poly-Si film has a columnar crystal structure, an irregularity is formed on the side surface of the dummy gate, leading to poor accuracy in processing of the gate size.
3. Since the silicon substrate does not exhibit an etching selectivity relative to the dummy gate, it is impossible to remove the oxide film on the silicon substrate until the dummy gate is completely removed. As a result, ions are implanted into the silicon substrate through the oxide film, making it impossible to form a shallow layer in the extended portion. Such being the situation, it was impossible to achieve miniaturization.

OBJECT AND SUMMARY OF THE INVENTION

An object of the present invention is to provide a method of manufacturing a semiconductor device, in which a desired ion implantation is applied to a desired region of a semiconductor substrate so as to ensure good pn junction characteristics and, thus, to improve markedly the element characteristics.

Another object of the present invention is to provide a method of manufacturing a semiconductor device by using a dummy gate, in which an RPT can be markedly shortened and the working accuracy of the gate size improved.

According to the first objective, the present invention provides a method of manufacturing a semiconductor device, comprising the steps of:
  forming a polymer film pattern in a predetermined region of a semiconductor substrate having a gate electrode or a dummy gate formed thereof with an insulating film interposed therebetween; and
  implanting ions into the semiconductor substrate using the polymer film pattern as a mask while cooling the semiconductor substrate;
  wherein the polymer film pattern is formed by the steps comprising:
    coating the semiconductor substrate with a polymer having a proportionally larger amount of carbon for forming a polymer film;
    forming a photoresist pattern on the polymer film; and
    transferring the pattern shape of the photoresist pattern onto the polymer film.

It is desirable for the semiconductor substrate to be cooled at temperatures not higher than 0° C., more preferably at temperatures not higher than −100° C., and most preferably at temperatures not higher than −150° C.

The manufacturing method of the present invention can further comprise the step of removing the polymer film pattern after implanting ions into the semiconductor substrate, and subjecting the semiconductor substrate to a heat treatment, and removing the polymer film pattern. In this case, it is preferred for the heat treatment to be performed at temperatures not lower than 500° C.

According to the second objective, the present invention provides a method of manufacturing a semiconductor device, comprising the steps of:
  forming a dummy gate on a semiconductor substrate;
  introducing an impurity into the semiconductor substrate using the dummy gate as a mask to form at least one source-drain diffusion region;
  forming and positioning an insulating film surrounding the dummy gate;
  removing the dummy gate to form an opening; and
  forming a gate electrode in an opening with a gate insulating film formed below the gate electrode;
  wherein the dummy gate is formed by the steps comprising:
    coating the semiconductor substrate with a polymer having a proportionally larger amount of carbon for forming a polymer film;
    forming a photoresist pattern on the polymer film; and
    transferring. the pattern shape of the photoresist pattern onto the polymer film.

The method of removing the dummy gate can be done by using an oxygen plasma or an active oxygen.

The manufacturing method of the present invention can comprise the step of oxidizing a surface layer of the source-drain diffusion region after removing the dummy gate. The manufacturing method of the present invention can also comprise the step of electrically activating the impurity by applying a heat treatment after formation of the source-drain diffusion region. In the manufacturing method of the present invention, it is desirable to carry out the process ranging between the step of forming the dummy gate and the step of removing the dummy gate under temperatures not higher than 600° C. Heat treatment after removal of the dummy gate can be performed at least at 600° C.

Alternatively, the manufacturing method according to the present invention can be carried out by forming a mono-silicide in a surface layer of the source-drain diffusion region, introducing a channel impurity into the surface of the semiconductor substrate where the dummy gate was removed and before the heat treatment of at least 600° C. is carried out. In this case, at least two of the activation of the impurity introduced into the source-drain diffusion region, namely, the di-silicidation of the mono-silicide, and the activation of the channel impurity can be performed simultaneously by the heat treatment carried out at a temperature of at least 600° C.

Additionally, the manufacturing method of the present invention can further comprise the step of forming a thin silicon oxide film on the semiconductor substrate before forming the dummy gate on the semiconductor substrate and removing the exposed region of the thin silicon oxide film before implanting an impurity into the semiconductor substrate by using the dummy gate as a mask.

It is desirable for the polymer in accordance with the present invention to have high carbon content, for manufacturing a semiconductor device, more particularly, to have a carbon content higher than that of the hydrogen content in terms of atomic ratio, preferably, there should be at least 50% of carbon by atomic ratio in the polymer. More preferably, the carbon content of the polymer should be at least 1.1 times higher than the hydrogen content and the polymer should comprise at least 55% by atomic ratio of carbon.

For manufacturing a semiconductor device in accordance with the present invention, it is preferred that the polymer film have a higher carbon content to be subjected to a heat treatment at about 600° C. to 900° C. and at a temperature elevation rate not higher than about 50° C./min. It is more preferable that the temperature elevation rate be not higher than 10° C./min.

In this disclosure, "comprises", "comprising" and the like can have the meaning ascribed to them in U.S. Patent Law and can mean "includes", "including" and the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE OF THE DRAWINGS

In the following detailed description, reference will be made to the accompanying drawings, wherein:

FIG. 4 shows a cross sectional view of a semiconductor device manufactured by the method illustrated in FIGS. 2A to 2C and 3A to 3C;

FIG. 5 shows a cross sectional view of a method of manufacturing a semiconductor device;

FIG. 6 shows a cross sectional view of another method of manufacturing a semiconductor device;

DETAILED DESCRIPTION OF THE INVENTION

Without wishing to unnecessarily limit the foregoing, the following shall discuss the invention with respect to certain preferred embodiments.

The present invention is directed to methods utilizing particularly effectively for the manufacture of a Large Scale Integrated ("LSI") element having a LOGIC and a Dynamic Random Access Memory ("DRAM") mounted together and, thus, has a prominently high industrial value.

Methods for manufacturing a semiconductor device in accordance with the present invention will now be described in detail with reference to the accompanying drawings. The invention shall be further described by way of the following non-limiting Examples that are also an illustration of the invention and are not to be considered a limitation of the invention, many apparent variations of which are possible without departing from the spirit or scope thereof.

EXAMPLES

Example I

Figure 1:
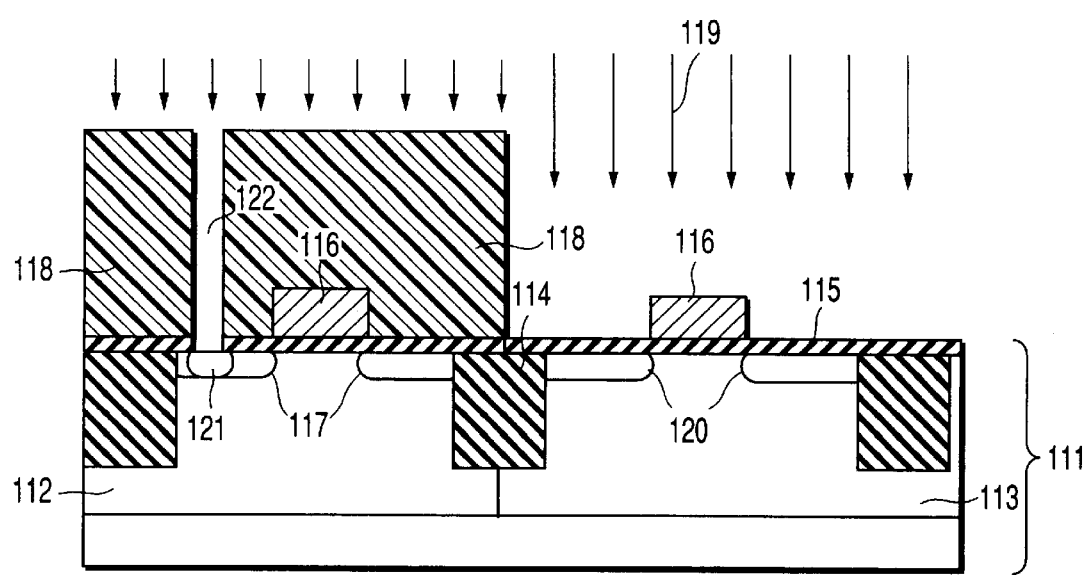
FIG. 1 shows a cross sectional view of a schematic drawing of a CMOS-FET.
Figure 2A:
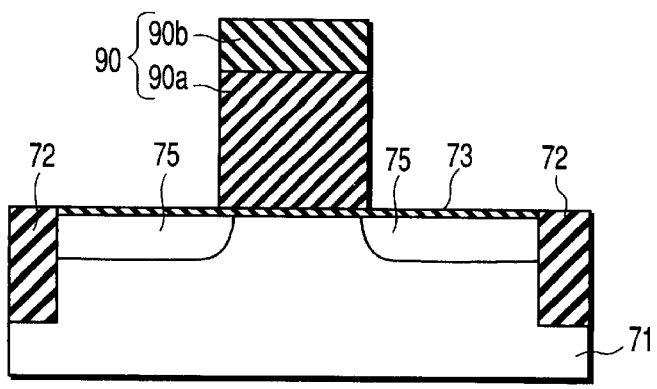
FIGS. 2A to 2C show cross sectional views collectively of the steps involved in manufacturing a semiconductor device.
Figure 2B:
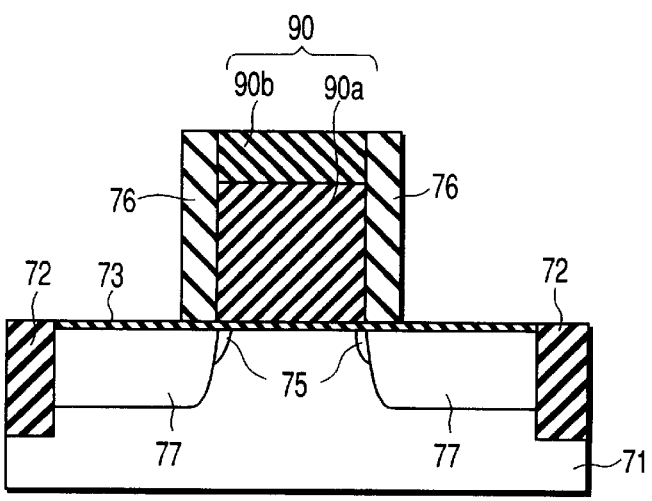
Figure 2C:
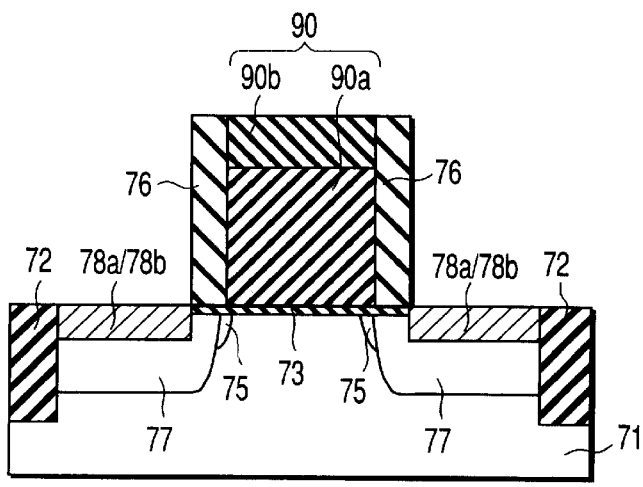
Figure 3A:
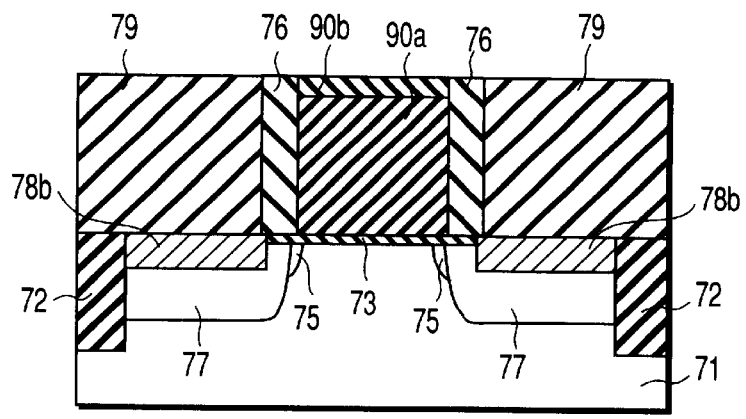
FIGS. 3A to 3C show cross sectional views collectively of the steps after FIG. 2C of a method of manufacturing a semiconductor device.
Figure 3B:
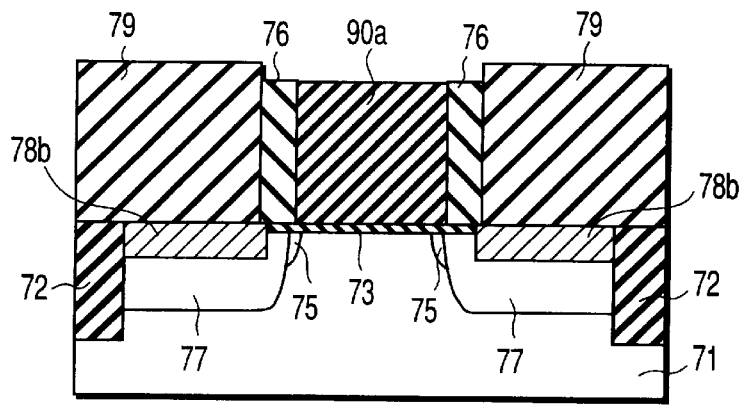
Figure 3C:
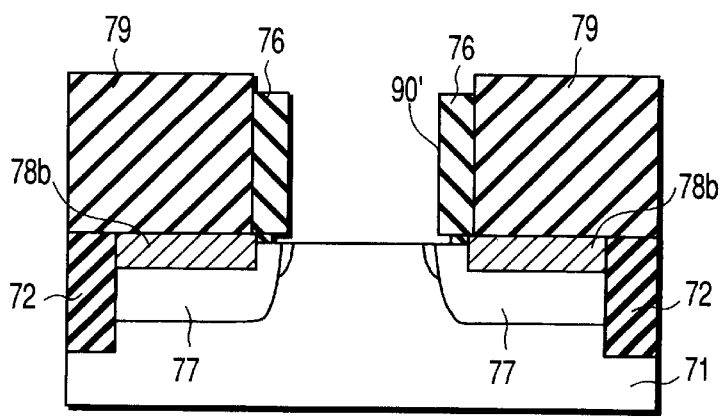
Figure 7:
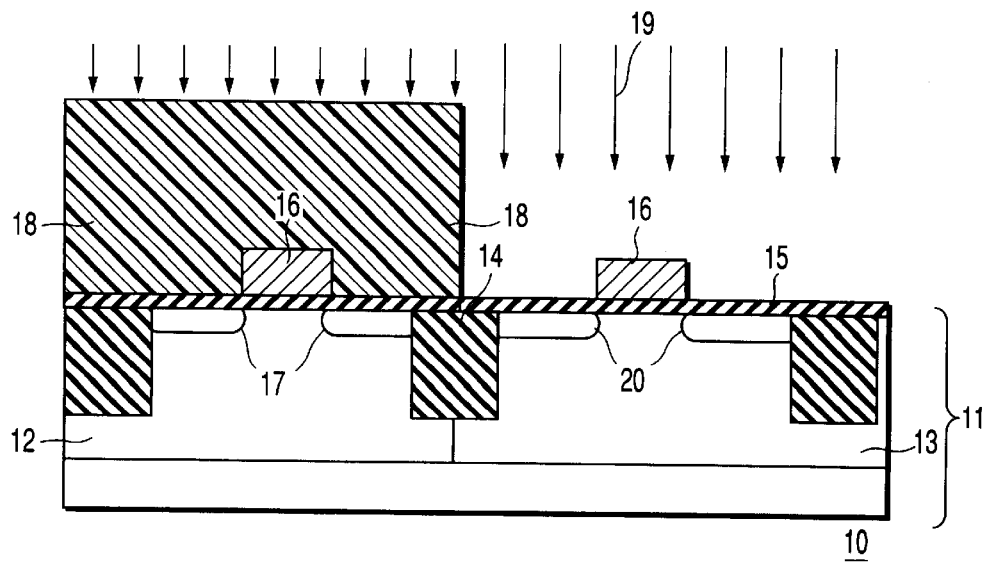
FIG. 7 shows a cross sectional view of a schematic drawing of a CMOS-FET for explaining, as an example, a method for manufacturing a semiconductor device in accordance with an embodiment of the present invention.

FIG. 7 shows a cross sectional view of a schematic drawing of the construction of a CMOS-FET 10 in performing an ion implantation in a method according to an embodiment of the present invention.

CMOS-FET 10 may be prepared as follows. First, an n-type well 12, a p-type well 13, and an element isolating insulating film 14 are formed on a semiconductor substrate 11. Second, after formation of a gate insulating film 15 on semiconductor substrate 11, a gate electrode or a dummy gate 16 is formed, followed by implanting ions of B or BF$_2$ into semiconductor substrate 11 in a concentration of approximately $1 \times 10^{14}$ to $5 \times 10^{15}$ cm$^{-2}$ so as to form a p-type impurity layer 17.

A mask 18 for implanting ions of an n-type impurity 19 may be prepared by using a polymer having a carbon content higher than a hydrogen content. The polymer used in accordance with the present invention may include, for example, a polymer containing about 60% of carbon by atomic ratio, about 1 to 2% of oxygen by atomic ratio, and hydrogen not higher than 40% by atomic ratio.

It is possible to use, for example, polymers represented by the general formulae (1a) to (1c) given below:

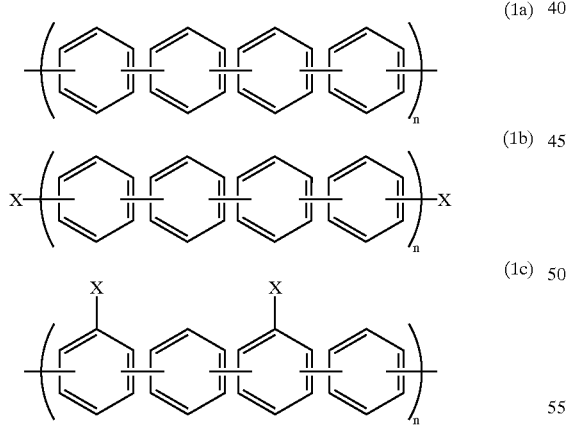

X represents the crosslinking point such as CH=CH$_2$ and n is an integer.

It is also possible to use polycarbodimide represented by general formula (2) given below, hetero aromatic conductive polymers represented by general formulae (3a) to (3g) below, and poly(anylene ethynylene) represented by general formulae (4a) to (4c) below:

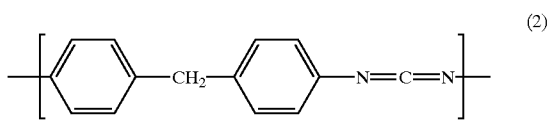

(2)

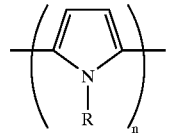

(3a)

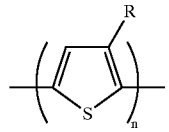

(3b)

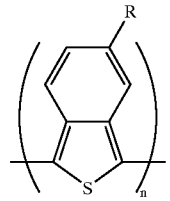

(3c)

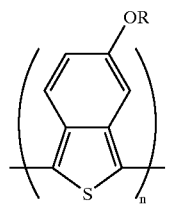

(3d)

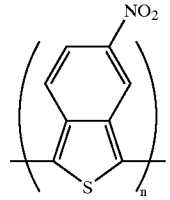

(3e)

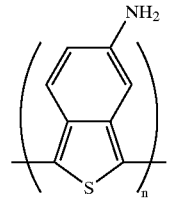

(3f)

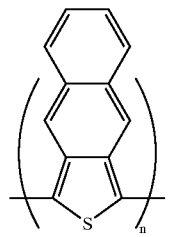

(3g)

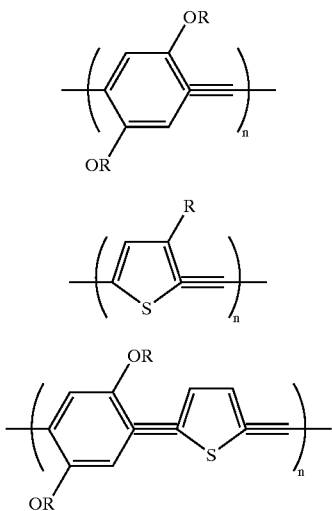

R represents an alkyl group, and n is an integer.

In addition, it is possible to use a novolak resin represented by general formula (5) below. In this case, about 5 to 20% of naphthoquinone diazide sulfonic acid ester represented by general formula (6) given below are mixed.

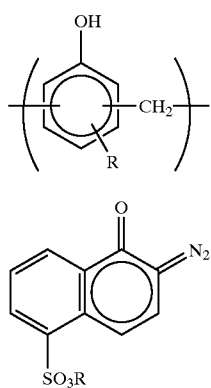

R in each of formulae (5) and (6) represents an alkyl group.

Preferably, the polymer in accordance with one embodiment of the present invention has a high carbon content, particularly, a molecular weight of about at least 5,000, preferably at least about 10,000. In order to prevent blister formation, at least 50% of the polymer should have a molecular weight of about at least 10,000.

The polymers meeting all of these conditions and, thus, can be used most preferably in the present invention, may include, but is not limited to, for example, polyarylene, PAr-06, or PAr-07. These polymers can be used alone or in combination with different kinds of polymers.

A solution containing the polymer of desire is dripped from at least one nozzle onto semiconductor substrate 11 while rotating semiconductor substrate 11 so as to coat the surface uniformly on semiconductor substrate 11 with the polymer solution, followed by baking the coated polymer solution at approximately 300° C. to 350° C. so as to form a polymer film. Heating treatment for approximately 30 to 60 minutes under an atmosphere containing oxygen is preferred. Additionally, the thickness of the polymer film is preferably within a range of approximately between 0.5 µm and 1.5 µm.

Then, a photoresist pattern having a thickness of approximately 1 to 3 µm is formed on the polymer film with high carbon content.

In the next step, the polymer film is processed with oxygen ions together with the photoresist pattern as a mask, followed by removing the photoresist pattern by using ethylene glycol or a thinner for the resist. Finally, a heat treatment is performed at approximately 600° C. to 900° C., preferably 600° C. to 800° C., for 10 minutes or less under a nitrogen ("$N_2$"), argon ("Ar") or vacuum atmosphere so as to form a polymer mask 18 as the mask for the ion implantation. It is desirable for the temperature elevation rate in the heat treating step to be approximately not higher than 50° C./min, preferably approximately not higher than 10° C./min. If the temperature is elevated at a rate specified in the present invention, it is possible to release excess gas from the polymer mask before the uppermost layer is cured. As a result, it is possible to cure the entire polymer mask without any blister formation.

Alternatively, it is possible to carry out the heat treatment in accordance with the present invention at a temperature not lower than approximately 600° C. before processing the polymer film. On the other hand, it is possible to carry out the heat treatment by using an electron beam or a flash lamp under the substrate temperature of approximately 200° C. to 400° C. The heat treatment can be performed either before or after processing of the polymer film. However, it is preferred to carry out the heat treatment before the processing of the polymer film because, if the heat treatment is performed after the processing of the polymer film, the size of the polymer film is decreased due to volume shrinkage.

While cooling semiconductor substrate 11 having polymer mask 18 formed thereon, an n-type impurity 19, such as arsenic ("As") or antimony ("Sb") is introduced by ion implantation at a concentration of about $1 \times 10^{14}$ to $5 \times 10^{15}$ $cm^{-2}$ as shown in FIG. 7. It is desirable for the cooling temperature of semiconductor substrate 11 to be not higher than approximately 0° C., preferably not higher than approximately −100° C., and most preferably not higher than approximately −150° C.

In accordance with an embodiment of the present invention, cracks are not formed in polymer mask 18 under the cooled state of semiconductor substrate 11, as apparent from the cross sectional view shown in FIG. 7.

After completion of the ion implantation, polymer film 18 is removed by using an oxygen plasma or an active oxygen, followed by applying a heat treatment of Rapid Thermal Annealing ("RTA") at approximately 900° C. to 1,000° C. for approximately 10 to 30 seconds. By this heat treatment, the implanted impurity ions are activated. Incidentally, when it comes to a semiconductor substrate having an irregular surface, it is possible to apply a heat treatment at about 550° C. for approximately 1 to 4 hours before the RTA heat treatment.

Crack forming polymer films of various samples were evaluated by changing the atomic ratio (C/H) of carbon to hydrogen, the absolute amount of carbon, the curing conditions, etc. with the results as shown in Table 1:

TABLE 1

| Sample | Composition (atomic %) | | | | C/H | Surface state of polymer film |
|---|---|---|---|---|---|---|
| | C | H | O | N | | |
| A | 660 | 339 | 00.3 | 00.1 | 11.54 | OK |
| B | 555 | 445 | 00 | 00 | 11.22 | OK |
| C | 550 | 449 | 00.2 | 00.3 | 11.02 | OK |
| D | 445 | 555 | 00 | 00 | 00.82 | NG |
| E | 440 | 559 | 00.2 | 00.3 | 00.68 | NG |
| F | 440 | 558 | 11 | 11 | 00.69 | NG |

The expression "OK" in the column under "Surface state of polymer film" in Table 1 denotes no crack formation, and "NG" denotes crack formation however small.

It was confirmed from table 1 that, where the atomic ratio of carbon to hydrogen is less than 1, cracks are generated. It was also confirmed that, where the atomic ratio of carbon to hydrogen is not less than 1, particularly not less than 1.1, and where the absolute amount of carbon is not less than 50%, more particularly not less than 55%, there would be no crack formation.

The polymer in accordance with the present invention has an excessively high carbon content, preferably an atomic ratio (C/H) of carbon to hydrogen is at least 1 approximately and the absolute amount of carbon is at least approximately 50%. More preferably, the atomic ratio (C/H) should be at least 1.1 and the absolute amount of carbon should be at least 55%. It should also be noted that it is preferred to carry out the curing in an environment of at least approximately 300° C.

The present invention is not limited to the Example I as described. Alternatively, variations are available within the technical scope of the present invention. For example, one can carry out the heat treatment without removing the polymer film after the ion implantation step, depending on the element manufacturing process.

As described above, cracks are not formed in Example I even if the polymer mask is removed. As a result, ions are implanted selectively into the desired region of the silicon substrate and, thus, the pn junction characteristics of the element are not deteriorated. Further, cracks are not formed in the gate insulating film positioned below the polymer mask.

A pn junction leak current was measured after the heat treatment described in Example I. As a result, leak current can be suppressed by at least two places, as compared to using a conventional photoresist mask.

Example II-1

Manufacturing Method of a Damascene Gate MOSFET Using a Polymer as a Damascene Gate In the manufacturing process of a transistor, it is important to carry out heat treatment in order to activate implanted ions. Therefore, the following experiment was conducted in order to confirm whether or not the polymer is capable of withstanding the heat treatment.

Figure 8:
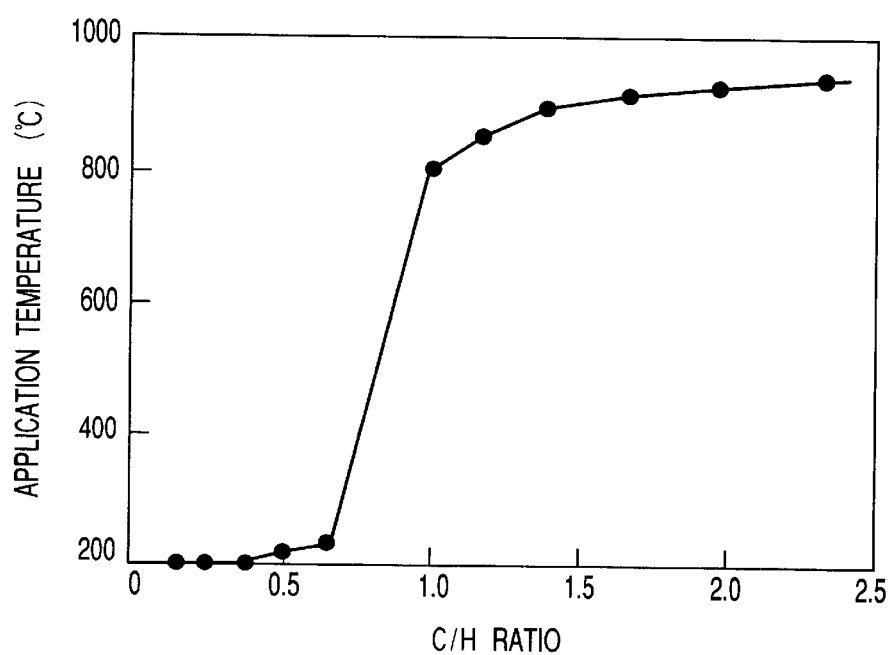
FIG. 8 depicts a graph showing a relationship between a polymer composition (C/H ratio) and the application temperature.

FIG. 8 is a graph showing experimental data with respect to the heat resistance of a polymer film. Specifically, the experiment was conducted by applying heat to a polymer film, while changing the atomic ratio of carbon to hydrogen of the polymer film. The heat was applied for one hour to simulate a heat treatment during a manufacturing process, and the heat resistance of the polymer film was evaluated in terms of the "applicable temperature" which does not bring about deformation of the film by thermal decomposition (degassing), peeling of the film, or cracking. In addition to carbon and hydrogen, oxygen is also present in the polymer film in an amount not larger than approximately 2%.

FIG. 8 shows that, where the C/H ratio is not smaller than approximately 1, a polymer film is resistant to heat treatment at a temperature not lower than approximately 800° C.

FIGS. 9A to 9C, 10A to 10C and 11A and 11B collectively show a method of manufacturing a transistor according to an embodiment of the present invention.

Figure 9A:
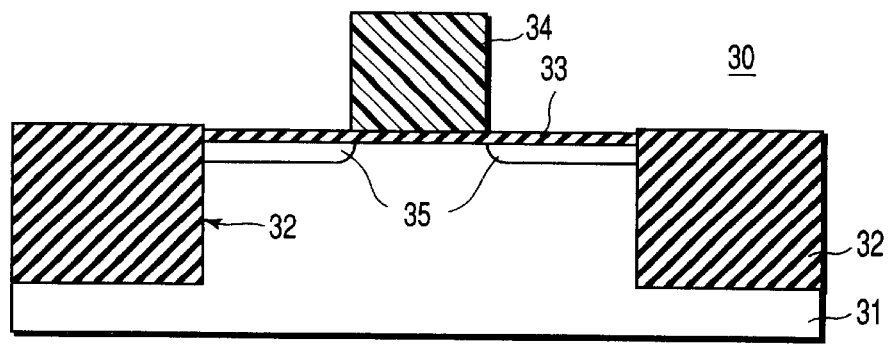
FIGS. 9A to 9C show cross sectional views collectively of a method of manufacturing a semiconductor device according to one of the embodiments of the present invention.

First, FIG. 9A shows a structure 30. Specifically, a groove 32' is formed on the surface of a silicon semiconductor substrate 31 by means of dry etching, followed by forming an insulating film 32 within the groove by means of deposition or coating for the element isolation. Silicon oxide film can be used as insulating film 32. Alternatively, SiNO can be used to form insulating film 32 since it has a thermal expansion coefficient close to that of silicon. The surface of insulating film 32 thus formed is polished by a chemical mechanical polishing ("CMP") process or a mechanical polishing ("MP") process.

An oxide film 33 for forming a dummy gate is formed in a thickness of about 3 to 10 nm by thermal oxidation on an element region surrounded by insulating film 32 for the element isolation, followed by forming a dummy gate 34 in a thickness of approximately 200 to 300 nm on insulating film 33. Dummy gate 34 can be formed by using a polymer having a carbon content higher than a hydrogen content. More specifically, dummy gate 34 can be formed as described previously by using the polymer described previously with respect to Example I.

Second, a solution containing the particular polymer is dripped by using at least one nozzle onto the surface of semiconductor substrate 31 having oxide film 33 formed thereon (dripping method), followed by rotating semiconductor substrate 31 so as to uniformly coat the surface of semiconductor substrate 31 with the solution (coating method). The coating is dried at approximately 300° C. to 350° C. to form a polymer film. Preferably, heating is carried out for approximately 30 to 60 minutes under an oxygen-containing atmosphere.

Third, a photoresist pattern or an Electron Beam ("EB") resist mask is formed on the resultant polymer film, followed by applying an exposure and subsequently processing the polymer film by reactive ion etching ("RIE") using an oxygen plasma. Then, the photoresist pattern is removed. Finally, heat treatment is carried out at approximately 600° C. to 900° C., preferably at approximately 600° C. to 800° C., for approximately 10 minutes or less under an $N_2$, Ar or vacuum atmosphere so as to form dummy gate pattern 34. During heat treatment, the temperature elevation rate is preferably not faster than about 50° C./min, preferably not faster than about 10° C./min. Where the temperature is elevated at the rate specified in the present application, it is possible to release excess gas from the polymer mask before the uppermost layer is cured. It follows that the entire polymer mask can be cured without forming blisters.

Incidentally, heat treatment can be performed at a temperature not lower than approximately 600° C. before processing the polymer film in order to form dummy gate 34 to avoid size reduction in the polymer film caused by volume shrinkage.

Alternatively, heat treatment can be accomplished by an electron beam or a flash lamp with the substrate temperature maintained at approximately 200° C. to 400° C. Heat treatment can be done either before or after processing the polymer film. However, heat treatment before processing of the polymer film is preferred since the polymer film may decrease in size due to volume shrinkage if heat treatment is done after processing the polymer film.

Additionally, a spin on glass ("SOG") film can be formed on the polymer film in order to increase etching selectivity ratio in processing the polymer film.

Further, extension regions 35 of the source and drain regions are formed in silicon semiconductor substrate 31 by implanting ions of arsenic ("As"), antimony ("Sb"), indium ("In"), boron ("B") or phosphorous ("P") with dummy gate pattern 34 used as a mask while cooling silicon semiconductor substrate 31. Extension regions 35 can also be formed by a plasma doping method or a gaseous phase diffusion method. Then, a heat treatment is carried out at approximately 800° C. to 900° C. for approximately 30 seconds or less by employing an RTA in which the temperature can be elevated at a rate not slower than 100° C./sec so as to achieve an electrical activation.

Figure 9B:
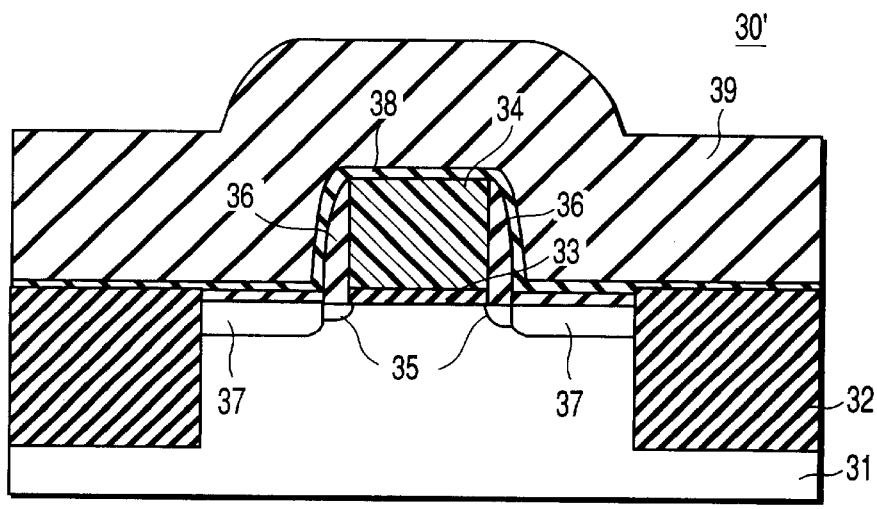

Fourth, structure 30' in FIG. 9B is prepared. First, a side wall insulating film 36 made of a silicon nitride film or a silicon oxynitride film is formed in a thickness of approximately 5 to 30 nm on the side wall of dummy gate 34. In some cases, an oxide film (not shown) having a thickness not larger than approximately 10 nm is interposed between side wall insulating film 36 and dummy gate 34 in order to prevent side wall insulating film 36 from being retreated in the lateral direction when removing dummy gate 34.

Subsequently, deep source-drain region 37 is formed in silicon semiconductor substrate 31 by an ion implantation method, a plasma doping method, or a gaseous phase diffusion method. Deep source-drain region 37 thus formed is electrically activated by applying a heat treatment at approximately 800° C. to 900° C. for about 30 seconds or less by means of an RTA in which the temperature can be elevated at a rate not slower than approximately 100° C./sec.

In order to increase the activated impurity concentration in deep source-drain region 37 thus formed, a heat treatment by using an electron beam for approximately one second under temperatures not lower than approximately 1,000° C. is applied. Alternatively, the activated impurity concentration can be increased by applying a heat treatment under similar conditions by using a laser beam having an ultraviolet ("UV") light region wavelength, a mercury lamp, or a xenon lamp.

After formation of the source-drain diffusion layers, a first interlayer insulating film 38 and a second interlayer insulating film 39 are formed successively. Each of these first interlayer insulating film 38 and second interlayer insulating film 39 can be formed by depositing a silicon nitride film and a silicon oxide film by a CVD method. Interlayer insulating film 38 acts as an etching stopper to prevent semiconductor substrate 31 from being etched by the etching of second interlayer insulating film 39 while forming a contact hole in deep portion 37 of the source-drain regions.

Figure 9C:
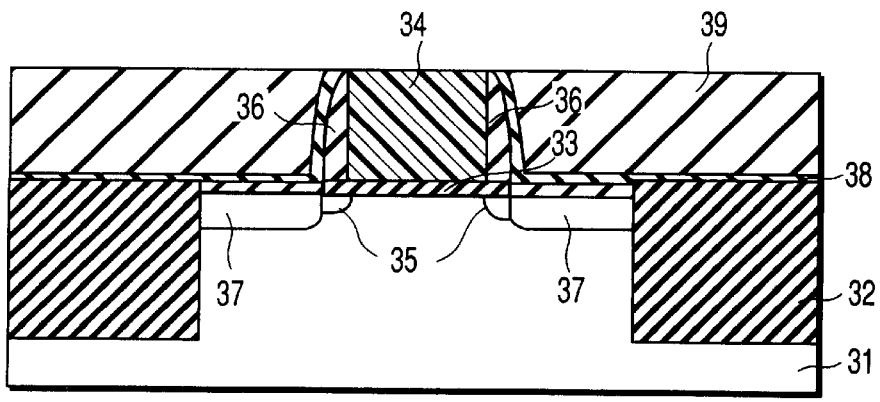
Figure 10A:
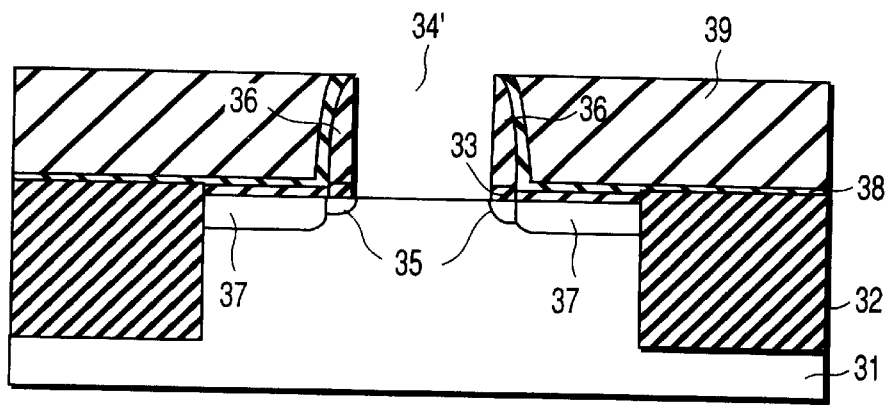
FIGS. 10A to 10C show cross sectional views collectively of the steps subsequent to FIG. 9C of a method of manufacturing a semiconductor device according to the first embodiment of the present invention.

The first and second interlayer insulating films 38 and 39 are planarized by CMP so as to expose the surface of dummy gate 34, as shown in FIG. 9C. Further, dummy gate 34 is removed as shown in FIG. 10A by ashing with an oxygen plasma or an active oxygen. Still further, in order to prevent formation of crystal defects in the underlying silicon semiconductor substrate 31, the thin oxide film 33 is removed by etching to form an open portion 34'.

Figure 10B:
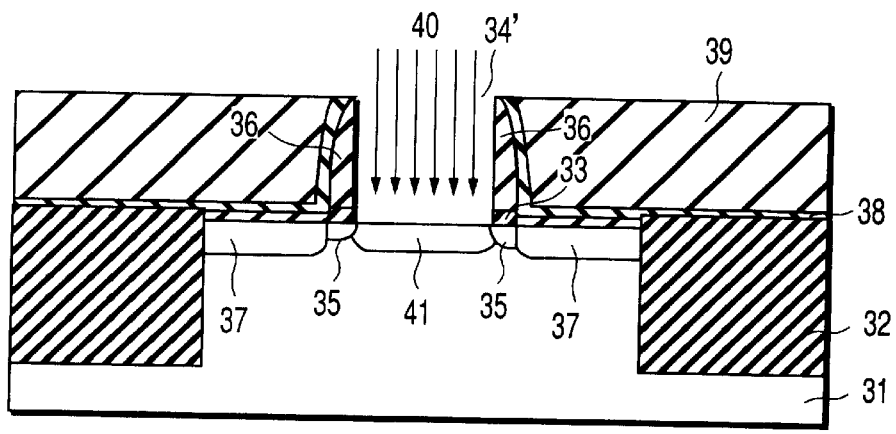

After formation of open portion 34', channel impurity ions 40 are implanted through open portion 34' so as to form a doping layer 41, as shown in FIG. 10B. Doping layer 41 is formed by implanting ions of, for example, As, Sb, In, B or Germanium ("Ge") under an accelerating energy of approximately 5 to 50 keV and at a dose of approximately $1 \times 10^{10}$ to $1 \times 10^{14}$ cm$^{-2}$. If the ion implantation is performed under a low temperature while cooling semiconductor substrate 31, the agglomeration of the atomic void is averted and the crystal defect is restored completely through heat treatment. Specifically, ion implantation should be carried out while cooling semiconductor substrate 31 at a temperature not higher than approximately −60° C., preferably not higher than approximately −100° C.

Figure 10C:
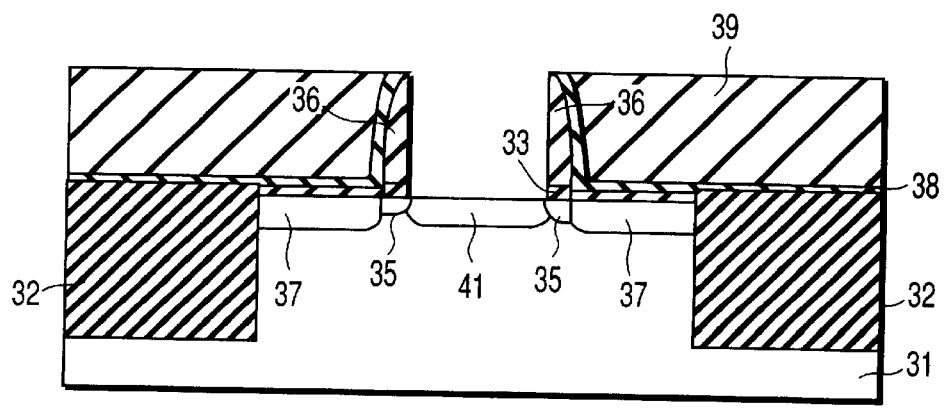

Fifth, insulating film 36, such as an oxide film, on the channel is removed by a treatment of diluted hydrofluoric acid, diluted ammonium fluoride solution or a mixed solution thereof, as shown in FIG. 10C.

Figure 11A:
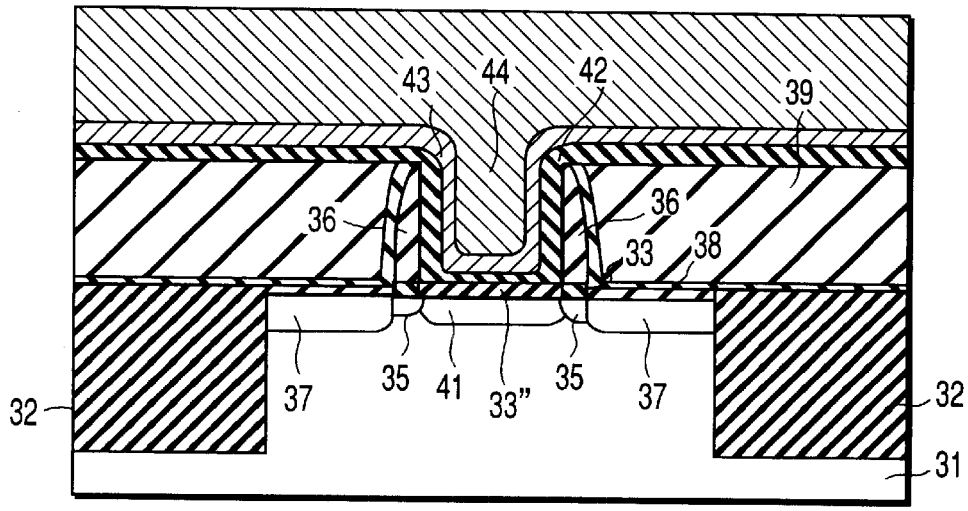
FIGS. 11A and 11B show cross sectional views collectively of the steps subsequent to FIG. 10C of a method of manufacturing a semiconductor device according to the first embodiment of the present invention.

After removing the insulating film, an oxide film 33" having a thickness of not greater than approximately 1 nm is formed in an open portion on the surface of semiconductor substrate 31 by using an oxygen radical or ozone. Further, an insulating film 42 having a relative dielectric constant larger than that of a silicon oxide film, a metallic conductive film 43 and a metal film 44 are formed successively, as shown in FIG. 11A. Insulating film 42 having a relative dielectic constant larger than that of a silicon oxide film can be formed by using Tantalum Oxide ("Ta$_2$O$_5$"), Titanium Oxide, ("TiO$_2$"), HfO$_2$, Zirconium Oxide ("ZrO$_2$"), CeO$_2$ or Yttrium Oxide ("Y$_2$O$_3$"). Insulating film 42 having such a large relative dielectric constant can also be formed by depositing a SiO$_x$N$_y$ film on the surface of semiconductor substrate 31 in a thickness of approximately 2 to 3 nm. Alternatively, insulating film 42 can also be formed by nitriding the surface of an oxide film under a temperature not higher than approximately 500° C. by using, for example, nitrogen radicals.

Metal conductive film 43 can be formed by depositing, for example, a metal nitride serving to determine the work function of a gate in a thickness not larger than approximately 10 nm.

A polycrystalline metallic material has certain crystal face properties where work function is changed. Therefore, polycrystalline metal having fine crystal grains not larger than approximately 30 nm, or an amorphous conductive material is preferred.

The material determining the work function includes, but is not limited to, for example, metal nitrides, such as tantalum nitride ("TaN"), niobium nitride, zirconium nitride, and hafnium nitride, a metal carbide, a metal boride, a metal-silicon nitride, a metal-silicon carbide, and a metal carbonitride. Titanium nitride has a work function of about 4.6 eV where the ratio of titanium to nitrogen is about 1:1. Thus, a low work function for titanium nitride can be set at approximately 4.5 eV or less by controlling the crystal face direction. Alternatively, where an amorphous structure is formed by adding carbon to TiN, the work function can be set at approximately 4.5 eV or less by controlling the composition of the amorphous structure.

It is effective to add oxygen within a predetermined range so as not to lower the conductivity by approximately 50% or more in order to obtain a thermal stability between these materials and the gate insulating film. Also, the electrode materials have excellent thermal stability at the interface with the tantalum oxide, titanium oxide, zirconium oxide, hafnium oxide or cesium oxide.

Figure 11B:
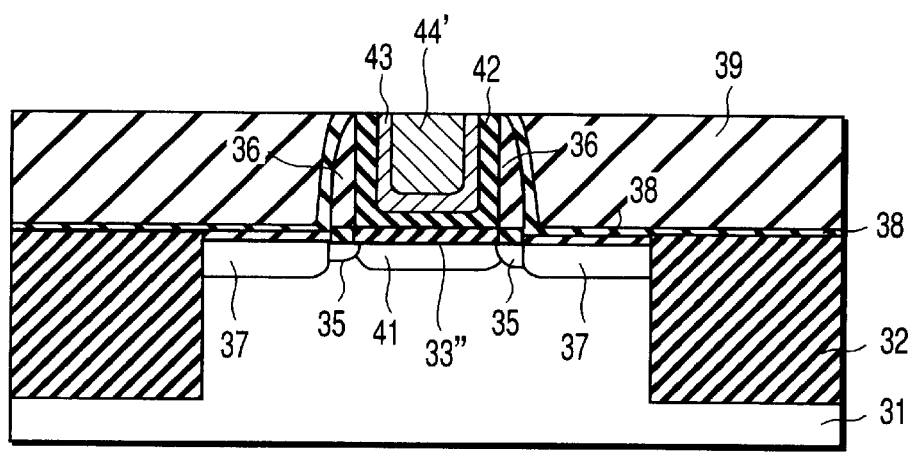

Sixth, depositing, and planarizing by CMP or MP metal film 44 made from a low resistivity material such as Al or W, is followed by an etching to form gate electrode 44', as shown in FIG. 11B.

Where it is necessary to lower the resistance of the source-drain regions, it is possible to form a metal silicide film by using, for example, Cobalt Silicon ("$CoSi_2$") or Titanium Silicon ("$TiSi_2$") in the source-drain region. Where the depth of diffusion layer 37 is not larger than approximately 100 nm, the layer corroded by the silicide is preferably positioned at least approximately 5 nm apart from the pn junction. The particular objective can be achieved by, for example, forming a silicon layer, a silicon-germanium layer or a silicon-germanium-carbon layer on the source-drain region by means of epitaxial growth.

As described above, a polymer is selected as a material for the gate in this Example, making it possible to employ the coating method in the film-forming step and the ashing method in the formed film removal step. Surprisingly, it follows that the RPT can be shortened by about 10 hours, as compared with known methods. Also, since the polymer is amorphous, an irregularity is not generated on the side surface of dummy gate 34, thus resulting in an approximately 10% improvement of processing accuracy of the gate size as compared to when a poly-Si film is used.

Example II-2

Figure 12:
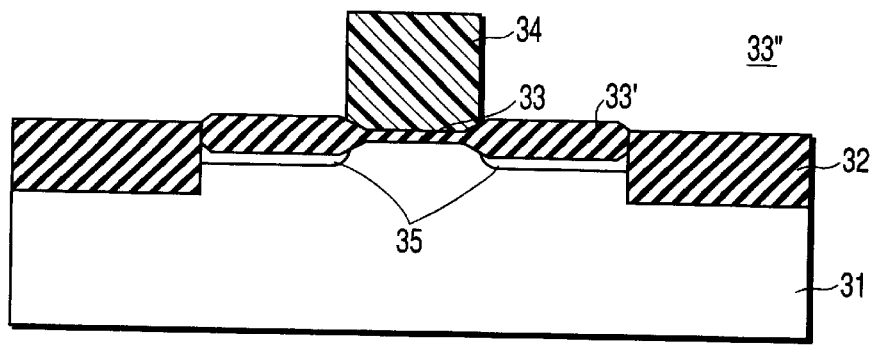
FIG. 12 shows a cross sectional view of a method of manufacturing a semiconductor device according to a second embodiment of the present invention.
Figure 13:
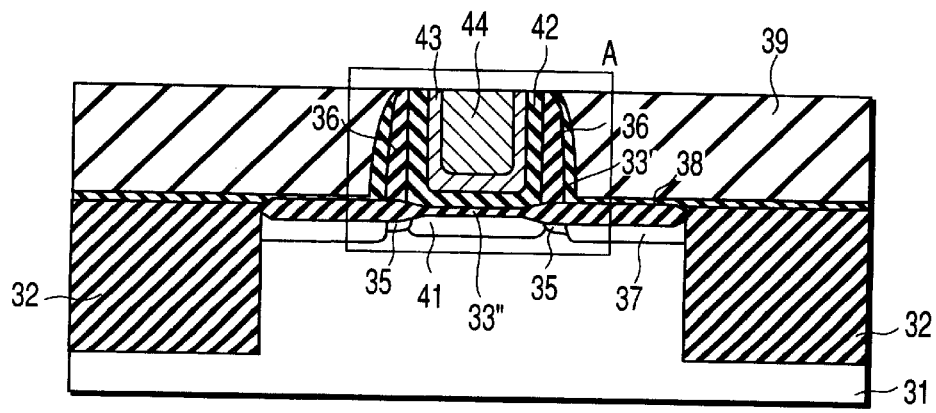
FIG. 13 shows a cross sectional view of a subsequent step of FIG. 12 according to the second embodiment of the present invention.
Figure 14:
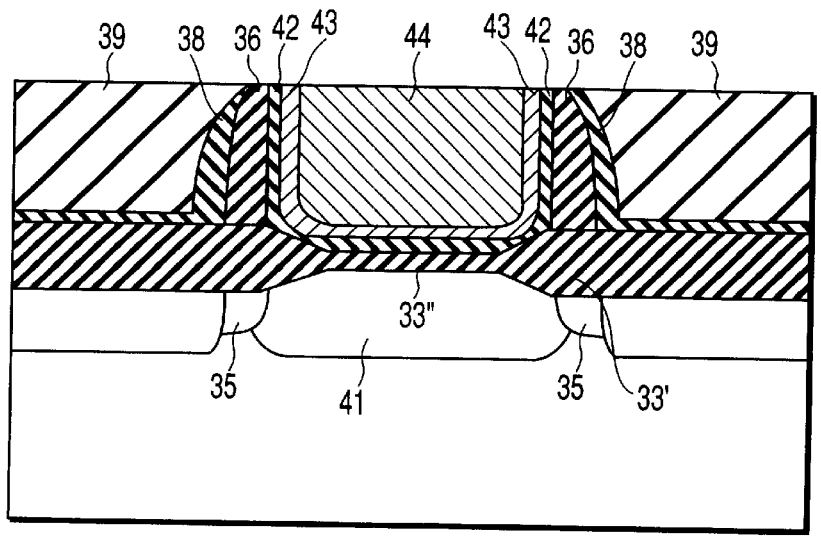
FIG. 14 shows an enlarged cross sectional view of the structure shown in FIG. 13 illustrating a method of manufacturing a semiconductor device according to one embodiment of the present invention.

FIGS. 12 to 14 collectively show a method of manufacturing a transistor according to another embodiment of the present invention. Like reference numerals are used to denote elements similar to those in Example II-1 previously described. Example II-2 differs from Example II-1 in that Example II-2 comprises the step of increasing the thickness of the oxide film in extension region 35 of the source-drain region on the surface of semiconductor substrate 31, after the formation of dummy gate 34.

First, structure 30" shown in FIG. 12 is prepared. Specifically, a groove is formed by dry etching on the surface of silicon semiconductor substrate 31, followed by forming insulating film 32 within the groove by means of deposition or coating for element isolation. Similarly, a silicon oxide film can be used as insulating film 32. Alternatively, a silicon nitroxide ("SiNO") film with a thermal expansion coefficient close to that of silicon, i.e., about 3 ppm/K can also be used. The surface of insulating film 32 thus formed is polished by a CMP method or an MP method.

Subsequently, oxide film 33 for dummy gate 34 is formed by thermal oxidation in a thickness of about 3 to 10 nm on an element region surrounded by insulating film 32 for the element isolation, followed by forming dummy gate 34 on oxide film 33 in a thickness of approximately 200 to 300 nm. Dummy gate 34 is formed by using a polymer having a carbon content higher than that of a hydrogen content, e.g., the polymer described previously with respect to Example I, by the method similar to that employed in Example II-1.

According to yet another embodiment of the present invention, an SOG film can be formed on the polymer film in order to increase the etching selectivity ratio in processing the polymer film.

Figure 15:
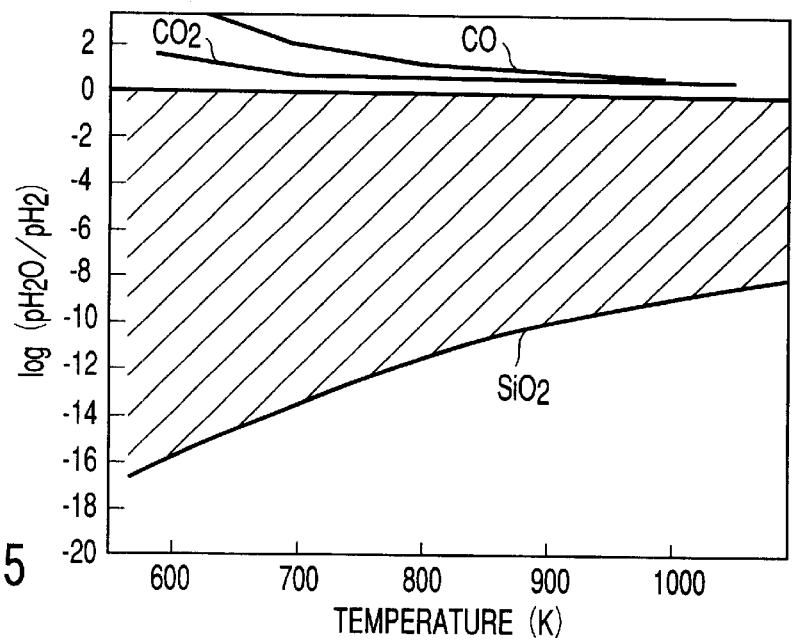
FIG. 15 depicts a graph showing a relationship between a logarithm ratio of water vapor partial pressure to hydrogen partial pressure and temperature.

Second, only the silicon substrate surface is selectively oxidized under a predetermined condition to form an oxide film or an oxynitride film 33' having a thickness larger than that of insulating film 33 of dummy gate 34. Specifically, the selective oxidation is carried out under the oxidizing condition shown as the shaded region in FIG. 15. Typically, the thermal oxidation is carried out at an oxidizing temperature of approximately 750° C. to 900°C. and a water vapor to hydrogen ratio ($H_2O/H_2$) of approximately between 100 ppm and 50%. A damascene gate MOSFET as shown in FIG. 13 is formed through the manufacturing steps as previously described with respect to Example II-1.

RTP can be shortened by about 10 hours when a dummy gate with a high carbon content in accordance with an embodiment of the present invention is used. As a result, the manufacturing efficiency is markedly improved by the method of the present invention. Additionally, the processing accuracy of the gate size can be improved by at least about 10%, as compared with poly-Si processing.

Furthermore, Example II-2 is also effective when in a portion of oxide film 33 that forms the gate insulating film is thinner than oxide film 33" on extension region 35 of the source-drain region. FIG. 14, which is an exploded view of FIG. 13, explains this phenomenon. Specifically, for forming dummy gate 34, the oxide film in the open portion is removed, followed by forming again an oxide film providing a gate insulating film. In this case, if oxide film is formed thinner than oxide film 33" on extension region 35 of the source-drain region, a stepped portion is formed in the boundary between oxide film forming the gate insulating film and oxide film 33". When the transistor is driven, an electric field is concentrated on the stepped portion so as to adversely affect the control of the transistor. In this Example, the thickness of oxide film 33 below dummy gate 34 is gradually increased in the vicinity of extension region 35 of the source-drain region, as shown in FIG. 14. It follows that, the electric field concentration occurring at the gate insulating film when the transistor is driven can be averted.

Example III

FIGS. 16A to 16C, 17A to 17C, 18A and 18B collectively show a method of manufacturing a transistor according to still yet another embodiment of the present invention.

Figure 16A:
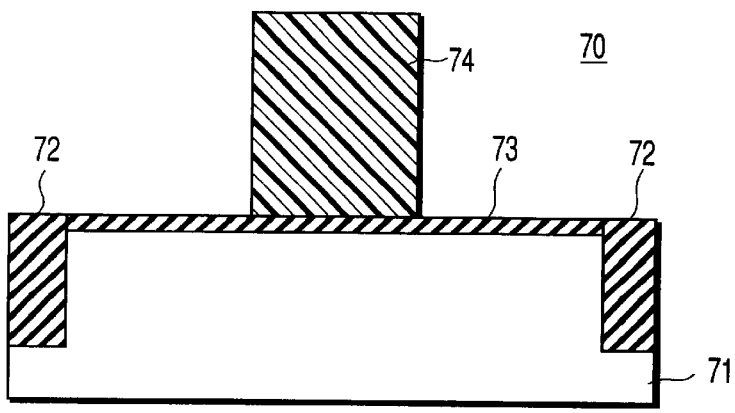
FIGS. 16A and 16B show cross sectional views collectively of manufacturing a semiconductor device according to a third embodiment-of the present invention.

First, structure 70 shown in FIG. 16A is prepared. Specifically, a groove is formed by dry etching on the surface of silicon semiconductor substrate 71, followed by forming an insulating film 72 within the groove by means of deposition or coating for element isolation A silicon oxide film can also be used as an insulating film. Alternatively, a SiNO film having a thermal expansion coefficient close to that of silicon, i.e., about 3 ppm/K can also be used. The surface of insulating film 72 thus formed is polished by a CMP method or an MP method.

Second, an oxide film 73 for dummy gate 74 is formed by thermal oxidation in a thickness of about 3 to 10 nm on an element region surrounded by insulating film 73 for element isolation, followed by forming dummy gate 74 on oxide film 73 in a thickness of about 200 to 300 nm. Dummy gate 74 is formed by using a polymer having a carbon content higher than a hydrogen content by the method taught in Examples II-1 and II-2. A SOG film can also be formed on the polymer film so as to increase the etching selectivity ratio in processing the polymer film.

Figure 16B:
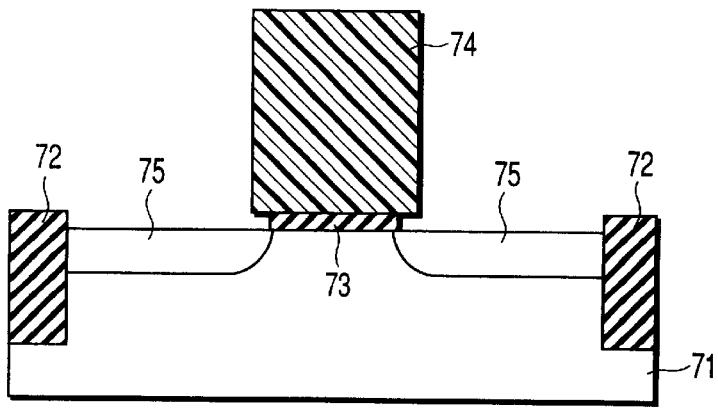

Third, as shown in FIG. 16B, extension region 75 of the source-drain region is formed by implanting ions such as As, Sb, In, B or P and using dummy gate pattern 74 as a mask.

In order to have a junction depth of not greater than about 30 nm for extension region 75, the ion implantation is done without any ions running through oxide film 73. To ensure that no ions will run through oxide film 73, the ion implantation is performed after the removal of oxide film 73 from the source-drain region by the treatment of diluted hydrofluoric acid followed by forming extension region 75 of the source-drain region, as shown in FIG. 16B. If oxide film 73 on the source-drain region is removed, the gate edge portion of oxide film 73 is also removed below dummy gate 74.

Contrary to Example III of the present invention, extension region 75 of the source-drain region is commonly formed after the ion implantation step by a heat treatment at a temperature higher than about 600° C., e.g., at about 800° C. to 900° C. for about 30 seconds or less using an RTA in which the temperature can be elevated at a rate not slower than about 100° C./sec. In Example III, however, a heat treatment at a temperature higher than about 600° C. is not applied after the ion implantation of As, Sb, In, B or P. As a result, the manufacturing process is simplified, and a shallow junction is formed. Nevertheless, if a heat treatment is to be applied in the method taught in Example III, a temperature of not higher than about 600° C. is preferred in order to restore the crystallinity of silicon substrate 71 that has been made amorphous by the ion implantation process.

As previously described in the background of the invention, it is impossible to form a transistor since it is impossible to remove oxide film 73 on source-drain region by conventional methods. However, this can easily be accomplished by methods taught and disclosed in the present invention.

Figure 17A:
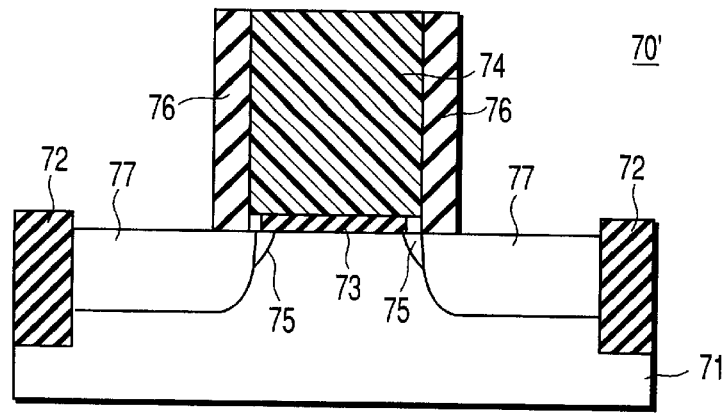
FIGS. 17A to 17C show cross sectional views collectively of the step subsequent to FIG. 16C of a method of manufacturing a semiconductor device according to the third embodiment of the present invention.

Third, structure 70' shown in FIG. 17A is prepared. Initially, a side wall insulating film 76 consisting of a silicon nitride film or a silicon oxynitride film is formed on the side wall of dummy gate 74 in a thickness of approximately 5 to 30 nm, followed by forming deep source-drain region 77 by ion implantation of As, Sb, In, B or P.

The deep source-drain region is commonly formed after the ion implantation step by a heat treatment at a temperature of higher than about 600° C., e.g., at about 800° C. to 900° C. for about 30 seconds or less by using for example, an RTA process in which the temperature can be elevated at a rate not slower than about 100° C./sec. Contrary to this method, Example III teaches not to apply a heat treatment at a temperature higher than about 600° C. after implanting ions including but not limited to As, Sb, In, B or P. As a result, the manufacturing process is simplified. If a heat treatment is to be applied in Example III, then the heat treatment should be applied at a temperature not higher than about 600° C. in order to restore the crystallinity of the silicon substrate that has been made amorphous by the ion implantation.

After formation of source-drain diffusion region 77, oxide film 73 on source-drain region 77 or a native oxide film is removed by the treatment with hydrofluoric acid, followed by depositing on the entire surface a metal having a resistivity of about 20 Ωcm and capable of forming a silicide so as to form a metal film. Specifically, a metal film like cobalt can be deposited by sputtering in a thickness of about 10 to 20 nm. In the case of using metal such as cobalt (which does not reduce silicon oxide film), it is preferred to first deposit a metal such as titanium (which can reduce silicon oxide film on the cobalt film) because titanium can diffuse into the cobalt film in the subsequent heat treating step so as to reduce any remaining silicon oxide film that was not previously removed at the interface between the cobalt film and silicon substrate 71.

Alternatively, a barrier film can be formed on the entire surface relative to, for example, nitrogen in order to prevent the surface of the cobalt film or the titanium film formed thereon from being nitrided in the subsequent heat treatment performed under a nitrogen atmosphere. It is possible to use, for example, a TiN film as the barrier film.

Then, a heat treatment, for example, is applied under a nitrogen gas atmosphere. As a result, cobalt alone deposited on source-drain region 77 on which silicon is present performs a silicide-forming reaction so as to form selectively a mono-silicide layer on the source-drain region alone.

Figure 17B:
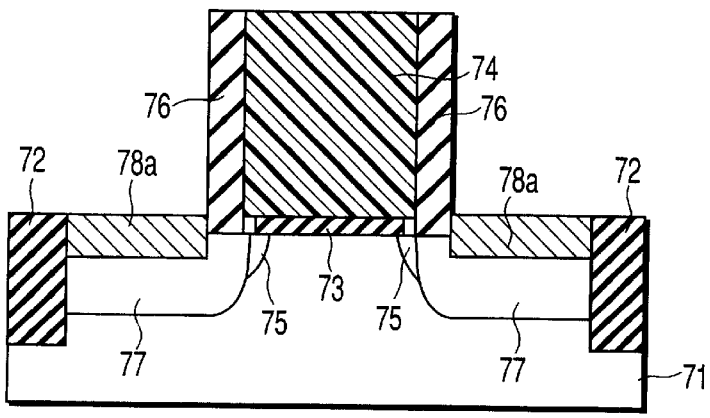

The temperature of the heat treatment can be determined depending on the kind of the metal deposited. In the case where cobalt is deposited, mono-silicide of cobalt is formed by a heat treatment of about 500° C. On the other hand, cobalt deposited on element isolating insulating film 72, side wall insulating film 76 and dummy gate 74 will not perform a silicide-forming reaction. The unreacted cobalt can be selectively removed by using, for example, a mixed solution consisting of sulfuric acid and hydrogen peroxide solution. As a result, cobalt mono-silicide layers 78a are selectively formed on only source-drain region 77 as shown in FIG. 17B and, then, a heat treatment is applied at about 800° C. so as to permit cobalt mono-silicide layers 78a to react with silicon and, thus, forming a cobalt disilicide layer having a low resistivity, of about 20 $\mu\Omega$cm.

Where an activating treatment is not applied to extension region 75 and deep source-drain region 77, i.e., where only a heat treatment under a temperature of not higher than about 600° C. is applied, it is possible to simultaneously activate extension region 75 and deep source-drain region 77. In the method taught in Example III, it is possible to omit the heat treatment performed at about 800° C. for converting cobalt mono-silicide layer 78a into cobalt disilicide layer because the conversion can be done in the subsequent heat treating step for forming a channel.

Fourth, an interlayer insulating film 79, such as a silicon oxide film, is formed by, for example, a CVD method. Interlayer insulating film 79 can also be formed after deposition of a thin film that is capable of suppressing the diffusion of cobalt such as a silicon nitride film in a thickness of about 20 nm.

Figure 17C:
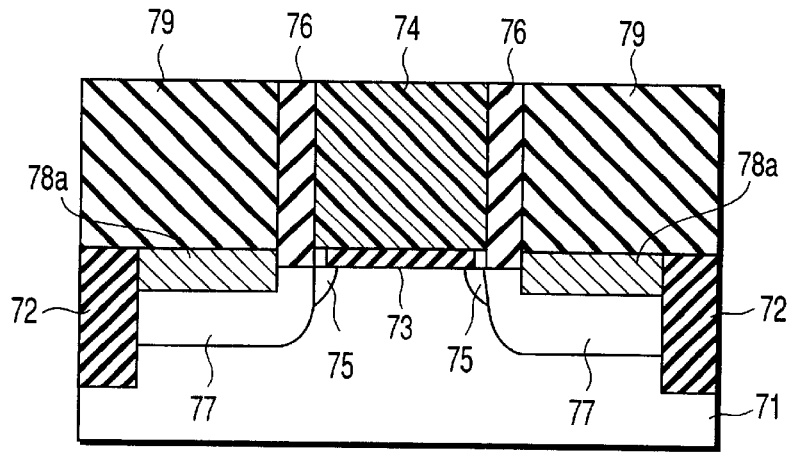
Figure 18A:
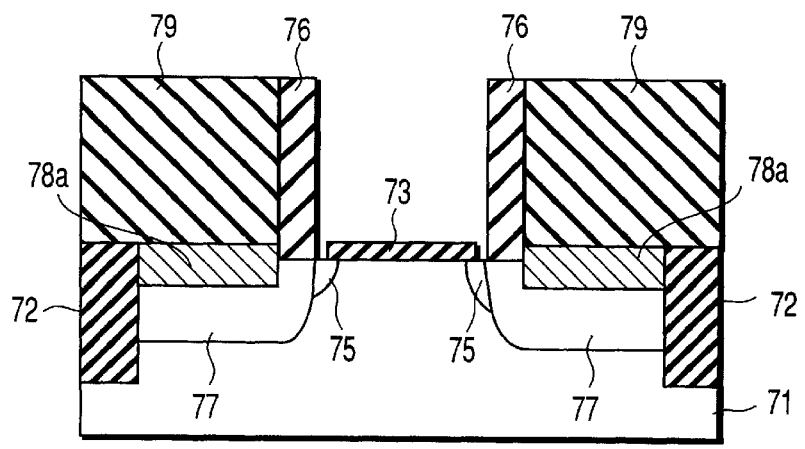
FIGS. 18A to 18C show cross sectional views collectively of the step subsequent to FIG. 17C of a method of manufacturing a semiconductor device according to the third embodiment of the present invention.

Further, the surface of interlayer insulating film 79 is planarized by, for example, a CMP method so as to expose the surface of dummy gate 74 as shown in FIG. 17C, followed by removing dummy gate 74 by using an oxygen plasma or an active oxygen as shown in FIG. 18A. Moreover, in order to prevent formation of crystal defects in the underlying silicon semiconductor substrate 71, the thin oxide film 73 is removed by etching so as to form open portion 74'.

Conventionally, where the ion implantation of extension region 75 is performed after removal of oxide films 73 on source-drain region 77, oxide layers 73 positioned below poly-Si layer 90a included in dummy gate 74 are also partially etched, as shown in FIG. 5. As a result, silicon substrate 71 is also etched in the portion where the oxide film 73 is removed in the etching step for removing the poly-Si layer 90a, as shown in FIG. 6.

However, in the present invention dummy gate 74 is formed from a polymer film having a carbon content higher than a hydrogen content. Therefore, an oxygen plasma or an active oxygen is used to etch the polymer film. It should be noted that, contrary to the conventional method, silicon substrate 71 in the present invention is not etched by the oxygen plasma or the active oxygen. Consequently, oxide film 73 below dummy gate 74 is not partly etched in the removal of dummy gate 74, thereby preventing silicon substrate 71 from being etched. It follows that the present invention makes it possible to perform the ion implantation of extension region 75 after removal of oxide film 73 on source-drain region 77 so as to achieve a narrower junction.

Fifth, channel impurity ion 40 is implanted into open portion 74' so as to form a doping layer 80, as shown in FIG.

18B. In this step, it is possible to implant ions of, for example, As, Sb, In, B or P under an accelerating energy of about 5 to 50 keV and at a dose of about $1 \times 10^{10}$ to $1 \times 10^{14}$ cm$^{-2}$. If the ion implantation is carried out while cooling semiconductor substrate 71, the agglomeration of the atomic void can be averted, making it possible to restore the crystal defects completely by a heat treatment. Also, as previously described, ion implantation is preferably done in a direction perpendicular to the surface of semiconductor substrate 71 or within about 5° from the perpendicular plane of the substrate surface. Further, it is possible to suppress mixing of hydrogen.

Heat treatment for activating the implanted ions is preferably set at about 800° C. to 900° C. for approximately 30 seconds or less by employing an RTA process in which the temperature can be elevated at a rate not lower than about 100° C./sec. As a result, a retrograde channel structure, i.e., a sharp profile in the depth direction, can easily be formed.

Further, in the step of activating channel layer 80, it is possible to simultaneously carry out the activation of the impurities in extended diffusion layer 75 and deep source-drain region 77 and conversion of cobalt mono-silicide layer 78a into cobalt disilicide layer. Specifically, where the heat treating step for activating the impurities is not performed immediately after the ion implantation for forming extended portion 75 and deep source-drain region 77, or where only the heat treatment for restoring the crystallinity of silicon is performed under a temperature not higher than about 600° C., extended portion 75 and deep source-drain region 77 is activated simultaneously in the heating step for activating channel layer 80. Further, where the heat treating step (to convert cobalt mono-silicide layer 78a into cobalt disilicide layer 78b) is not performed soon after the selective formation of cobalt mono-silicide layer 78a on only deep source-drain region 77 shown in FIG. 17B, cobalt mono-silicide layer 78a is converted into cobalt disilicide layer 78b in the heating step for activating channel layer 80.

As discussed previously, in the heat treatment for activating channel layer 80, the activation of the impurities in extended portion 75, deep source-drain region 77 and the conversion from cobalt mono-silicide layer 78a to cobalt disilicide layer 78b are all carried out simultaneously. The particular treatment taught and disclosed in the present invention overcomes two disadvantages inherent in the conventional process.

First, according to the present invention, since only one heat treatment under a high temperature of about 600° C. is used to activate the impurities after the ion implantation for forming extended portion 75, it is possible to suppress markedly the thermal diffusion of the impurities introduced into the silicon substrate by ion implantation. As a result, a shallower junction is achieved. Contrary to the present invention, the heat treatment under conventional method has a temperature higher than 600° C. and is repeated four times after ion implantation into extended portion 75. This includes the activating step immediately after ion implantation, the activating step of deep source-drain region 77, the heat treating step for converting cobalt mono-silicide layer 78a into cobalt disilicide layer 78b, and the activating process of channel layer 80. Clearly, it is difficult to form extended portion 75 with a shallow junction.

Second, the merit of the present invention is directed to the material of dummy gate 74. Specifically, the polymer film for dummy gate 74 according to the present invention has a carbon content higher than hydrogen content. Therefore, dummy gate 74 is capable of withstanding the heat treatment performed under a temperature of not lower than 800° C. However, where dummy gate 74 contains a polymer having a carbon to hydrogen ratio of not larger than 1 (depending on the difference in the manufacturing process), dummy gate 74 is deformed under a temperature higher than 600° C.

In the present invention, a transistor can be formed by even using a polymer with a low resistance to heat under a temperature higher than 600° C. In other words, during heat treatment to activate channel layer 80, it is possible to achieve a simultaneous activation of the impurities in extended portion 75 and deep source-drain region 77, and the conversion of cobalt mono-silicide layer 78a to cobalt disilicide layer 78b. It follows that all the heat treatments in the present invention are conducted at a temperature not higher than about 600° C. The heat treatment processes include formation of polymer film dummy gate 74 and, the removal of polymer film dummy gate 74 before formation of channel layer 80. Consequently, the present invention is still effective even when a polymer having a low resistance to heat under a temperature of higher than about 600° C. is used.

Figure 18B:
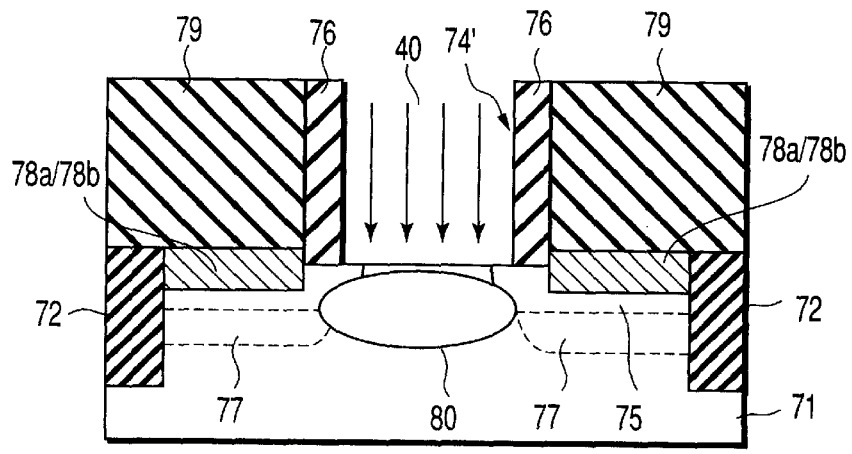

Sixth, the insulating film such as an oxide film on the channel is removed by diluted hydrofluoric acid, diluted ammonium fluoride or a mixed solution thereof, as shown in FIG. 18B.

Then, an oxide film 81 having a thickness of not greater than about 1 nm is formed in open portion 74' on the surface of semiconductor substrate 71 by using an oxygen radical or ozone. Next, an insulating film 82 having a relative dielectric constant larger than that of the silicon oxide film is deposited, followed by depositing a metal conductive film 83 on insulating film 82. Insulating film 82 can be formed by using, for example, $Ta_2O_5$, $TiO_2$, $HfO_2$, $ZrO_2$, $CeO_2$ or $Y_2O_3$. It is also possible to form insulating film 82 with a large relative dielectric constant by depositing a $SiO_xN_y$ film on the surface of the semiconductor substrate in a thickness of about 2 to 3 nm. Alternatively, insulating film 82 can also be formed by nitriding the surface of an oxide film under a temperature not higher than approximately 500° C. by using, for example, nitrogen radicals.

Metal conductive film 83 can be formed by depositing, for example, a metal nitride serving to determine the work function of a gate in a thickness not larger than 10 nm.

A polycrystalline metallic material has properties that the work function is changed depending on the crystal face. Therefore, it is desirable to use a polycrystalline metal having fine crystal grains not larger than about 30 nm, or an amorphous conductive material.

The material determining the work function includes, but is not limited to, metal nitrides such as tantalum nitride, niobium nitride, zirconium nitride, and hafnium nitride, a metal carbide, a metal boride, a metal-silicon nitride, a metal-silicon carbide, and a metal carbonitride. Titanium nitride has a work function of about 4.6 eV where the ratio of titanium to nitrogen is about 1:1. It is possible to set the work function of titanium nitride at about 4.5 eV or less by setting the crystal face direction with a low work function. Alternatively, where an amorphous structure is formed by adding carbon to TiN, the work function can be set at about 4.5 eV or less by controlling the composition of the amorphous structure.

Figure 18C:
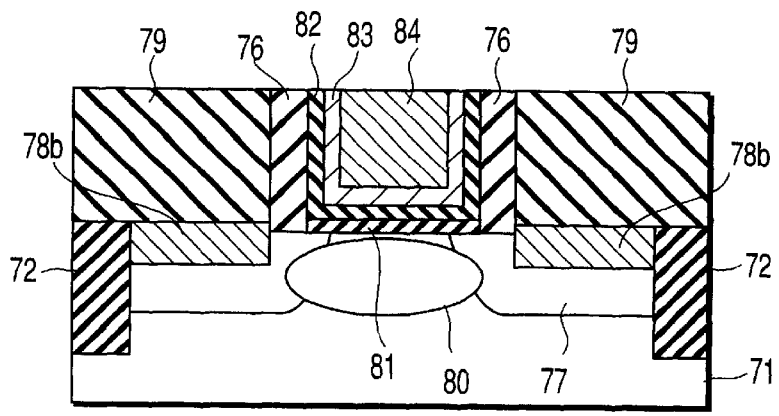

Seventh, metal film 84 made from material having a low resistivity such as Al or W is deposited, followed by planarizing metal film 84 by a CMP or an MP process and subsequently apply etching so as to finish forming gate electrode 84 as shown in FIG. 18C.

As described above, the advantages of the present invention include, but are not limited to, a shorter RPT (by about 10 hours) when using a dummy gate formed from a polymer with a high carbon content so as to markedly improve the manufacturing efficiency. Also, the processing accuracy of the gate size is improved by at least about 10%, as compared with the case of using a poly-Si. Further, since the ion implantation for forming extension region 75 of the source-drain diffusion region can be performed after removal of silicon oxide film 73 on silicon substrate 71, it is possible to achieve a shallow junction, with the result that the semiconductor device can be further miniaturized. Also, since the three heat treatment steps in the conventional method (including the heat treatment for forming a channel region, for forming the source-drain diffusion region and for converting silicide into disilicide) can now be performed in one single heat treatment, RTP can be further shortened by about 4 hours.

Example IV

Conditions for Curing Polymer for Use as a Mask

As shown in FIG. 9A, a resist pattern 34 used as a mask for ion implantation was formed on semiconductor substrate 31 having an oxide film 33 formed therefrom as taught in Example II-1 of the present application.

In forming resist pattern 34, a polyarylene solution was prepared by dissolving about 5 to 15% of polyarylene in about 85 to 95% of cyclohexane. The substrate surface was coated with the solution thus prepared by a spin coating method, followed by applying a heating treatment to the coating at about 300° C. to 350° C. for approximately 30 to 60 minutes under an oxygen-containing atmosphere so as to form a polymer film.

Then, a photoresist pattern was formed on the resultant polymer film, followed by applying a light exposure using an i-line stepper. Further, a developing treatment was applied so as to process the polymer film, followed by removing the photoresist pattern.

Then, resist pattern 34 was cured by heating the substrate to about 200° C. while irradiating the substrate with a UV light having a wavelength of about 200 to 300 nm by using a UV cure apparatus (e.g., "200PCU" manufactured by FUSION Inc.). The surface of resist pattern 34 can be cured by applying heat treatment while employing a UV light irradiation so as to decrease the reflow. As a result, deterioration of the pattern profile is averted.

Several problems generally occur in forming photoresist pattern 34. Where resist pattern 34 is heated to about 220° C. (when coupling of polymer takes place) and before the temperature reaches a certain level, reflow occurs which causes deterioration of the pattern profile. In this Example taught in this application, the deterioration is averted.

Figure 19:
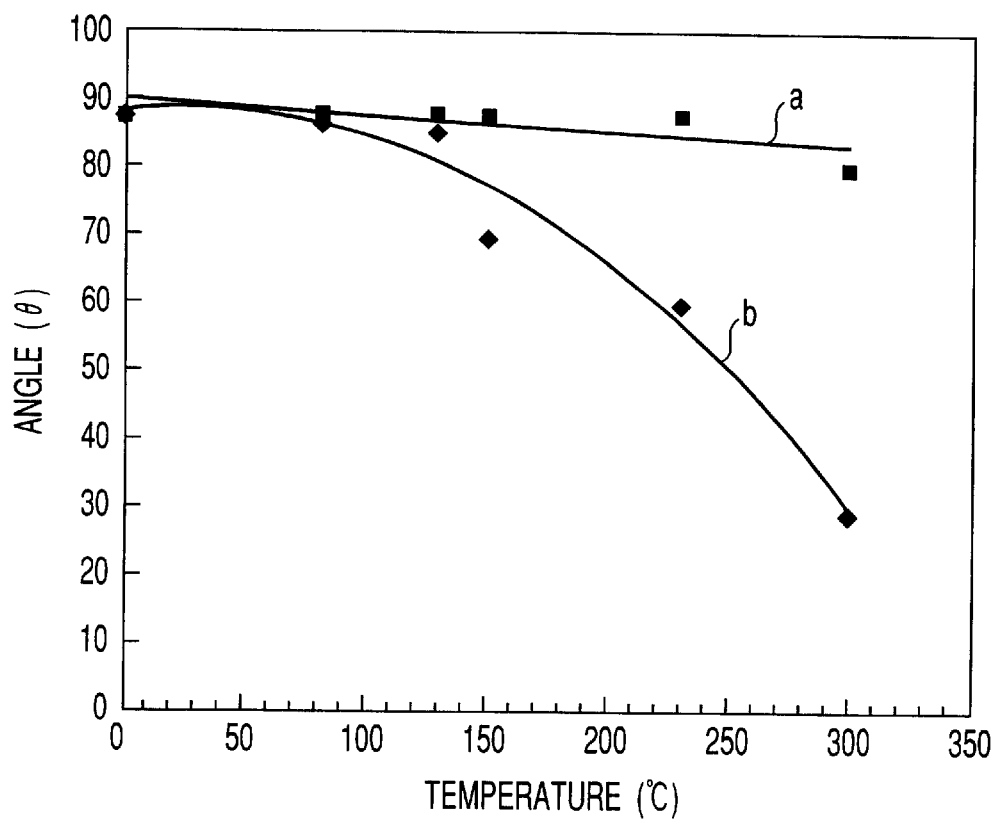
FIG. 19 depicts a graph showing a relationship between an ultraviolet ("UV") cure temperature and a side wall angle of a resist pattern.
Figure 20:
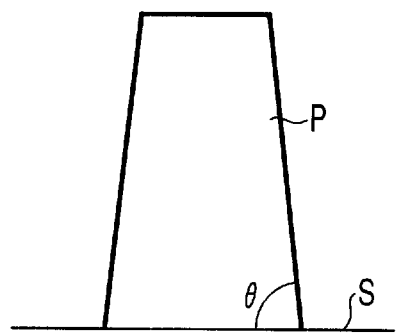
FIG. 20 shows a cross sectional view of a resist pattern in accordance with the present invention.

FIG. 19 is a graph showing a relationship between reflow temperature and an angle of the pattern side wall. Curve a represents the reflow occurrence during a UV light irradiation, while curve b represents the reflow occurrence when no UV light irradiation is used. The angle of the pattern side wall represents the angle θ shown in FIG. 20, i.e., the angle made between the side wall of the pattern P and the surface S of the substrate.

FIG. 19 shows that, where the UV light irradiation was used (curve a), the angle θ of the pattern side wall was maintained at about 80° even if the heating was performed at 300° C. On the other hand, where the UV light irradiation was not used (curve b), the angle θ of the pattern side wall was lowered to 70° or less by heating at 300° C. The experimental data support the benefit of using UV cure. Incidentally, substantially the same effect of the UV irradiation can be obtained in both continuous irradiation and flash irradiation.

In the next step, resist pattern 34 was subjected to an additional heat treatment at about 230° C., higher than 220° C., for approximately 60 seconds. The additional heat treatment was for crosslinking the polymers contained in the resist pattern.

In this example, additional heat treatment was performed at about 230° C. because the polymer used for forming resist pattern 34 can be crosslinked at a temperature not lower than 220° C. Consequently, heating temperature varies depending on the polymer used. In other words, the temperature for which additional heat treatment is applied is the temperature at which the polymer used can be crosslinked.

In this example, the heat treatment during the UV light irradiation and the additional heat treatment were carried out separately. However, it is possible to carry out the heat treatment only once by using a UV cure apparatus.

An n-type impurity such as As or Sb was introduced by ion implantation at a concentration of about $1 \times 10^{14}$ to $1 \times 10^{15}$ cm$^{-2}$ while cooling semiconductor substrate 31, with resist pattern 34 thus formed as a mask. The cooling temperature of semiconductor substrate 31 is preferably not higher than about 0° C., more preferably not higher than about –100° C., and most preferably not higher than about –150° C.

In this example, cracks are not generated in resist pattern 34 when semiconductor substrate 31 is cooled to about –160° C. Thus, ion implantation can be performed at any time.

After completion of the ion implantation, resist pattern 34 was removed by an oxygen plasma or an active oxygen treatment, followed by applying an RTA heat treatment at about 900° C. to 1,000° C. for approximately 10 to 30 seconds. By this heat treatment, the implanted impurity ions are activated. Incidentally, where semiconductor substrate 31 has an irregular surface, it is possible to carry out a heat treatment at about 550° C. for approximately 1 to 4 hours before the RTA treatment.

As described above, in this Example, the polymer is heated while applying an UV light irradiation in curing the polymer. As a result, reflow in the polymer was averted and, thus, the pattern profile is not deteriorated.

Having thus described in detail preferred embodiments of the present invention, it is to be understood that the invention defined by the appended claims and specific details are not to be limited to particular details set forth in the above description and representative embodiments, as many apparent variations thereof are possible without departing from the spirit or scope of the present invention.

What is claimed is:

1. A method of manufacturing a semiconductor device, comprising the steps of:

forming a polymer film pattern on a semiconductor substrate having one of a gate electrode and a dummy gate formed thereon with an insulating film interposed therebetween; and implanting ions into said semiconductor substrate with said polymer film pattern used as a mask while cooling said semiconductor substrate;

wherein said polymer film pattern is formed by the steps of:

coating said semiconductor substrate with a polymer having a carbon content higher than a hydrogen content and an atomic ratio of carbon not lower than 50% so as to form a polymer film;

forming a photoresist pattern on said polymer film; and transferring a pattern shape of said photoresist pattern onto said polymer film.

2. The method of manufacturing a semiconductor device according to claim 1, further comprising the step of cooling the semiconductor substrate at temperatures not higher than 0° C.

3. The method of manufacturing a semiconductor device according to claim 1, further comprising the steps of:

removing the polymer film pattern after the step of implanting ions into the semiconductor substrate; and subjecting the semiconductor substrate to a heat treatment after the step of removing the polymer film pattern.

4. The method of manufacturing a semiconductor device according to claim 3, wherein said semiconductor substrate is subjected to the heat treatment under temperatures not lower than 500° C.

5. The method of manufacturing a semiconductor device according to claim 1, wherein said polymer has a carbon content at least 1.1 times as high as a hydrogen content, and an atomic ratio of carbon in said polymer is at least 55%.

6. The method of manufacturing a semiconductor device according to claim 1, wherein said polymer film pattern is subjected to a heat treatment at 600° C. to 900° C. at a temperature elevation rate not higher than 50° C./min.

7. The method of manufacturing a semiconductor device according to claim 6, wherein said temperature elevation rate is not higher than 10° C./min.

8. A method of manufacturing a semiconductor device, comprising the steps of:

forming a dummy gate on a semiconductor substrate;

introducing an impurity into the semiconductor substrate with said dummy gate being used as a mask so as to form source-drain diffusion regions;

forming an insulating film in a manner to surround said dummy gate;

removing the dummy gate to form an opening; and forming a gate electrode in said opening with a gate insulating film formed below said gate electrode;

wherein said dummy gate is formed by the steps of:

coating said semiconductor substrate with a polymer having a carbon content higher than a hydrogen content and an atomic ratio of carbon not lower than 50% so as to form a polymer film;

forming a photoresist pattern on said polymer film; and transferring a pattern shape of said photoresist pattern onto said polymer film.

9. The method of manufacturing a semiconductor device according to claim 8, wherein said step of removing the dummy gate is performed by using one of an oxygen plasma and an active oxygen.

10. The method of manufacturing a semiconductor device according to claim 8, further comprising the step of selectively oxidizing a surface layer of the source-drain diffusion regions after the step of removing said dummy gate.

11. The method of manufacturing a semiconductor device according to claim 8, further comprising the step of electrically activating an impurity by applying a heat treatment after formation of the source-drain diffusion regions.

12. The method of manufacturing a semiconductor device according to claim 8, wherein a process ranging between the step of forming the dummy gate and the step of removing the dummy gate is carried out under temperatures not higher than 600° C.

13. The method of manufacturing a semiconductor device according to claim 12, further comprising the step of performing a heat treatment under temperatures exceeding 600° C. after the step of removing the dummy gate.

14. The method of manufacturing a semiconductor device according to claim 13, further comprising the steps of:

forming a mono-silicide layer in a surface layer of the source-drain diffusion region; and introducing a channel impurity into the surface of the semiconductor substrate having the dummy gate removed therefrom after the step of removing the dummy gate and before the step of carrying out the heat treatment under temperatures exceeding 600° C., wherein a plurality of activations of the impurity introduced into the source-drain diffusion regions, a conversion of the mono-silicide layer into a di-silicide layer, and an activation of the channel impurity can be performed simultaneously by the heat treatment carried out under temperatures exceeding 600° C.

15. The method of manufacturing a semiconductor device according to claim 8, further comprising the steps of:

forming a thin silicon oxide film on the semiconductor substrate before the step of forming the dummy gate on the semiconductor substrate; and removing an exposed region of the thin silicon oxide film before the step of implanting an impurity into the semiconductor substrate by using the dummy gate as a mask.

16. The method of manufacturing a semiconductor device according to claim 8, wherein said polymer has a carbon content at least 1.1 times as high as a hydrogen content, and an atomic ratio of carbon in said polymer is at least 55%.

17. The method of manufacturing a semiconductor device according to claim 8, wherein said polymer film pattern is subjected to a heat treatment at 600° C. to 900° C. at a temperature elevation rate not higher than 50° C./min.

18. The method of manufacturing a semiconductor device according to claim 17, wherein the temperature elevation rate is not higher than 10° C./min.

19. A method of manufacturing a semiconductor device, comprising the steps of:

forming a dummy gate on a semiconductor substrate;

introducing an impurity into the semiconductor substrate with said dummy gate being used as a mask so as to form source-drain diffusion regions;

forming an insulating film in a manner to surround said dummy gate;

removing the dummy gate to form an opening; and forming a gate electrode in said opening with a gate insulating film formed below said gate electrode;

wherein said dummy gate is formed by the steps of:

coating said semiconductor substrate with a polymer having a carbon content at least 1.1 times as high as a hydrogen content and an atomic ratio of carbon of at least 55% so as to form a polymer film;

forming a photoresist pattern on said polymer film; and transferring a pattern shape of said photoresist pattern onto said polymer film.

* * * * *